(12) United States Patent
Kim et al.

(10) Patent No.: US 7,435,634 B2
(45) Date of Patent: Oct. 14, 2008

(54) METHODS OF FORMING SEMICONDUCTOR DEVICES HAVING STACKED TRANSISTORS

(75) Inventors: Hyun-Su Kim, Gyeonggi-do (KR);
Gil-Heyun Choi, Gyeonggi-do (KR);
Jong-Ho Yun, Gyeonggi-do (KR);
Sug-Woo Jung, Gyeonggi-do (KR);
Eun-Ji Jung, Gyeonggi-do (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 295 days.

(21) Appl. No.: 11/398,192

(22) Filed: Apr. 5, 2006

(65) Prior Publication Data

US 2006/0246709 A1 Nov. 2, 2006

(30) Foreign Application Priority Data

Apr. 18, 2005 (KR) .................. 10-2005-0032003

(51) Int. Cl.
*H01L 21/84* (2006.01)
(52) U.S. Cl. ............... 438/153; 257/E21.561
(58) Field of Classification Search ......... 438/151–166; 257/E21.561
See application file for complete search history.

(56) References Cited

U.S. PATENT DOCUMENTS

| | | | |
|---|---|---|---|
| 4,272,880 A * | 6/1981 | Pashley | ............... 438/153 |
| 5,747,367 A | 5/1998 | Kadosh et al. | |
| 5,818,069 A | 10/1998 | Kadosh et al. | |
| 6,232,637 B1 | 5/2001 | Gardner et al. | |

\* cited by examiner

*Primary Examiner*—Richard A. Booth
(74) *Attorney, Agent, or Firm*—Myers Bigel Sibley & Sajovec

(57) ABSTRACT

A method of forming a semiconductor device may include forming an interlayer insulating layer on a semiconductor substrate, and the interlayer insulating layer may have a contact hole therein exposing a portion of the semiconductor substrate. A single crystal semiconductor plug may be formed in the contact hole and on portions of the interlayer insulating layer adjacent the contact hole opposite the semiconductor substrate, and portions of the interlayer insulating layer opposite the semiconductor substrate may be free of the single crystal semiconductor plug. Portions of the single crystal semiconductor plug in the contact hole may be removed while maintaining portions of the single crystal semiconductor plug on portions of the interlayer insulating layer adjacent the contact hole as a single crystal semiconductor contact pattern. After removing portions of the single crystal semiconductor plug, a single crystal semiconductor layer may be formed on the interlayer insulating layer and on the single crystal semiconductor contact pattern. A second interlayer insulating layer may be formed on the single crystal semiconductor layer, and a common contact hole may be formed through the second interlayer insulating layer, through the single crystal semiconductor layer, and through the first interlayer insulating layer to expose a portion of semiconductor substrate. In addition, a conductive contact plug may be formed in the common contact hole in contact with the semiconductor substrate. Related devices are also discussed.

28 Claims, 17 Drawing Sheets

METHODS OF FORMING SEMICONDUCTOR DEVICES HAVING STACKED TRANSISTORS

RELATED APPLICATION

The present application claims the benefit of priority from Korean Patent Application No. 10-2005-0032003 filed Apr. 18, 2005, the disclosure of which is hereby incorporated herein in its entirety by reference.

FIELD OF THE INVENTION

The present invention relates to electronics, and more particularly, to methods of forming semiconductor devices and related devices.

BACKGROUND

As semiconductor devices have become more highly integrated, structures including transistors multi-stacked within a limited area of a semiconductor substrate have been developed. A static random access memory (SRAM) device, for example, may use a stacked structure of transistors.

FIG. 1 is an equivalent circuit diagram of a conventional inverter. Referring to FIG. 1, a gate electrode of a first transistor TR1, (e.g., an n-channel metal oxide semiconductor (NMOS) transistor) and a gate electrode of a second transistor TR2, (e.g., a p-channel MOS (PMOS) transistor) are commonly connected to an input signal $V_{in}$ line. A source of the second transistor TR2 is connected to a power voltage $V_{DD}$ line, and drains C of the second transistor TR2 and the first transistor TR1 are connected to an output line $V_{out}$. A source of the first transistor TR1 is connected to a ground voltage $V_{SS}$ line. The device having the above circuit structure may operate as an inverter.

The inverter of FIG. 1 may be formed by arranging the first and second transistors TR1 and TR2 (of different conductivity types) on the same plane. To provide a more highly integrated device, the inverter may be configured in a stacked structure with the second transistor TR2 stacked on the first transistor TR1.

FIG. 2 is an equivalent circuit diagram of a conventional full CMOS SRAM device. Referring to FIG. 2, the conventional full CMOS SRAM device includes two inverters and two transfer transistors TR3 and TR6. The inverters are configured with driving transistors TR1 and TR4, (e.g., NMOS transistors) and load transistors TR2 and TR5, (e.g., PMOS transistors) with the two inverters being cross-coupled to each other. A source of each load transistor TR2 and TR5 is connected to a power voltage $V_{DD}$ line, and a source of each driving transistor TR1 and TR4 is connected to a ground voltage $V_{SS}$ line. Gate electrodes of the transfer transistors TR3 and TR6 are connected to a word line, and one source/drain of each of the transfer transistors is connected to a bit line BL or $\overline{BL}$. The other one of the source/drain of each transfer transistor TR3 and TR6, a drain of each driving transistor TR1 and TR4, and a drain of each load transistor TR2 and TR5 are connected to respective common terminals/contacts C1 and C2. In addition, the common terminal C1 is connected to the gate electrode of the driving transistor TR4 and the gate electrode of the load transistor TR5. Likewise, the common terminal C2 is connected to the gate electrodes of the driving transistor TR1 and the gate electrode of the load transistor TR2.

Although the SRAM device may be formed by arranging the six transistors TR1 to TR6 on the same plane, the SRAM device may be formed by arranging the driving transistors TR1 and TR4 at a lower layer, the load transistors TR2 and TR5 on the driving transistors TR1 and TR4 on a middle layer, and the transfer transistors TR3 and TR6 on the load transistors TR2 and TR5 on an upper layer. Accordingly it may be possible to enhance an integration density of the device employing this stacked structure.

A conventional method of forming the semiconductor device having the stacked transistors will be discussed below with reference to FIGS. 3 to 5. Referring to FIG. 3, a first transistor provided with a first gate pattern 202 and source/drain regions 204 is formed on a semiconductor substrate 200, and an etch stop layer 206 is conformally formed on the resulting structure. A first insulating layer 208 is stacked on the etch stop layer 206. The first interlayer insulating layer 208 and the etch stop layer 206 are patterned in sequence to form a contact hole 210 exposing the semiconductor substrate 200. An epitaxial contact plug 212 is formed to fill the contact hole 210 through a selective epitaxial growth (SEG) process. A semiconductor single crystalline layer 214 is formed on the entire surface of the semiconductor substrate 200. A second transistor configured with a second gate pattern 216 and source/drain regions 218 may be formed on the semiconductor single crystalline layer 214. A second interlayer insulating layer 220 is formed to cover the resulting structure. While not shown in the drawings, a plurality of transistors may be formed on an additional semiconductor layer(s) by repeating the above processes including the SEG process.

Thereafter, referring to FIGS. 4 and 5, the second interlayer insulating layer 220, the semiconductor single crystalline layer 214 and the epitaxial contact plug 212 are etched to form a common contact hole 222 for a common contact plug (not shown) to commonly connect the transistors on respective layers to each other. In general, the common contact plug may be formed at the location of the epitaxial contact plug 212 for the sake of expediency of the manufacturing process. Since the common contact hole 222 is formed by etching a few layers in sequence, it may have a high aspect ratio. In addition, when forming the common contact hole 222, the epitaxial contact plug 212 formed of single crystal silicon is etched to expose the semiconductor substrate 200 (which is also formed of single crystal silicon) so that there may not be an etch selectivity between the epitaxial contact plug 212 and the semiconductor substrate 200. Therefore, the etching process may not be stopped using an end-point detection technique but should be stopped using a time-etch technique.

Because the etch stop point may not be accurately controlled during the etching process, there may remain a portion of the epitaxial contact plug 212 so that the semiconductor substrate 200 is not exposed, as illustrated in FIG. 4. On the contrary, if the etching process is excessively performed, the semiconductor substrate 200 may be excessively etched, as illustrated in FIG. 5. If a portion of the epitaxial contact plug 212 remains so that the semiconductor substrate 200 is not exposed as shown in FIG. 4, a resistance of the common contact may be undesirably high because the epitaxial contact plug 212 may be formed of undoped single crystal silicon having a high resistance. Meanwhile, if the semiconductor substrate 200 is over-etched, a leakage current may increase due to an etch loss.

Therefore, accurate control of the etching process may be desired so that the etch can be stopped when the semiconductor substrate is exposed. To this end, an etch stop layer may be used. However, because the epitaxial contact plug 212 is formed to penetrate through the etch stop layer 206 and because the common contact hole 222 is formed to penetrate through the epitaxial contact plug 212, the etch stop layer 206 may not be present at the location where the common contact hole 222 will be formed, when forming the common contact hole 222. Accordingly, accurate formation of the common contact hole 222 may be difficult using the etch stop layer according to conventional methods of forming semiconductor devices having stacked transistors.

SUMMARY

According to some embodiments of the present invention, methods of forming a semiconductor device may include forming an interlayer insulating layer on a semiconductor substrate with the interlayer insulating layer having a contact hole therein exposing a portion of the semiconductor substrate. A single crystal semiconductor plug may be formed in the contact hole and on portions of the interlayer insulating layer adjacent the contact hole opposite the semiconductor substrate, and portions of the interlayer insulating layer opposite the semiconductor substrate may be free of the single crystal semiconductor plug. Portions of the single crystal semiconductor plug in the contact hole may be removed while maintaining portions of the single crystal semiconductor plug on portions of the interlayer insulating layer adjacent the contact hole as a single crystal semiconductor contact pattern. After removing portions of the single crystal semiconductor plug, a single crystal semiconductor layer may be formed on the interlayer insulating layer and on the single crystal semiconductor contact pattern, and a second interlayer insulating layer may be formed on the single crystal semiconductor layer. A common contact hole may be formed through the second interlayer insulating layer, through the single crystal semiconductor layer, and through the first interlayer insulating layer to expose a portion of semiconductor substrate, and a conductive contact plug may be formed in the common contact hole in contact with the semiconductor substrate.

In addition, an etch stop layer may be formed on the semiconductor substrate before forming the first interlayer insulating layer, and the etch stop layer and the interlayer insulating layer may be layers of different materials. Moreover, the contact hole may extend through the first interlayer insulating layer and the etch stop layer, and the common contact hole may be formed through the etch stop layer. The interlayer insulting layer may include a recess therein adjacent the contact hole opposite the substrate, and the single crystal semiconductor plug may be formed in the contact hole and in the recess adjacent the contact hole. After removing portions of the single crystal semiconductor plug in the contact hole and before forming the single crystal semiconductor layer, an insulating plug may be formed in the contact hole.

A first transistor may be formed on the semiconductor substrate before forming the interlayer insulating layer, and a second transistor may be formed on the single crystal semiconductor layer before forming the second interlayer insulating layer. Moreover, the common contact hole may expose a gate electrode the first transistor and/or a gate electrode of the second transistor, and/or the conductive contact plug may be electrically connected to a gate electrode of the first transistor and/or a gate electrode of the second transistor. In addition or in an alternative, the common contact hole may expose a source/drain region of the first transistor and/or a source/drain region of the second transistor, and/or the conductive contact plug may be electrically connected to a source/drain region of the first transistor and/or a source/drain region of the second transistor.

According to some other embodiments of the present invention, methods of forming a semiconductor device may include forming an etch stop layer on a semiconductor substrate. A first interlayer insulating layer may be formed on the etch stop layer, and the etch stop layer and the interlayer insulating layer comprise different materials. A single crystal semiconductor contact pattern may be formed in a recess of the first interlayer insulating layer. Portions of the first interlayer insulating layer outside the recess may be free of the single crystal semiconductor contact pattern, and the single crystal semiconductor contact pattern may be isolated from the semiconductor substrate. A single crystal semiconductor layer may be formed on the single crystal semiconductor contact pattern and on the first interlayer insulating layer outside the recess, and a second interlayer insulating layer may be formed on the single crystal semiconductor layer. A preliminary contact hole may be formed through the second interlayer insulating layer, through the single crystal semiconductor layer, through the single crystal semiconductor contact pattern, and through the first interlayer insulating layer to expose a portion of the etch stop layer. A common contact hole may be formed by removing the portion of the etch stop layer exposed through the preliminary contact hole, and a conductive contact plug may be formed in the common contact hole.

More particularly, forming the single crystal semiconductor contact pattern may include forming a dual width contact hole having a relatively narrow portion extending through the interlayer insulating layer and through the etch stop layer to expose the semiconductor substrate and having a relative wide portion extending only partially through the first interlayer insulating layer. An epitaxial semiconductor contact plug may be formed in the relatively narrow and relatively wide portions of the dual width contact hole, and at least portions of the semiconductor contact plug may be removed from the relatively narrow portion of the dual width contact hole while maintaining portions of the semiconductor contact plug in the relatively wide portion of the contact hole. An insulating plug may be formed in the relatively narrow portion of the dual width contact hole. Moreover, the insulating plug and the etch stop layer may include different materials, and/or the epitaxial semiconductor contact plug may be formed using selective epitaxial growth (SEG) process.

In addition, a first transistor may be formed on the semiconductor substrate before forming the etch stop layer, and a second transistor may be formed on the single crystal semiconductor layer before forming the second interlayer insulating layer. The common contact hole may expose a gate electrode the first transistor and/or a gate electrode of the second transistor, and/or the conductive contact plug may be electrically connected to a gate electrode of the first transistor and/or a gate electrode of the second transistor. In addition or in an alternative, the common contact hole may expose a source/drain region of the first transistor and/or a source/drain region of the second transistor, and/or the conductive contact plug may be electrically connected to a source/drain region of the first transistor and/or a source/drain region of the second transistor.

Surfaces of the single crystal semiconductor contact pattern and the first interlayer insulating layer opposite the semiconductor substrate may be substantially within a same plane. Moreover, the common contact hole may expose portions of the single crystal semiconductor layer and the semiconductor substrate, and an ohmic layer may be formed between the conductive contact plug and the exposed portions of the single crystal semiconductor layer and the semiconductor substrate. The ohmic layer, for example, may include a metal silicide.

Forming the conductive contact plug may include forming a conformal metal layer on the second interlayer insulating layer, on sidewalls of the common contact hole, and on an exposed portion of the semiconductor layer, forming a conformal barrier layer on the metal layer, and forming a metal plug on the barrier layer. The barrier layer, for example, my include a metal nitride.

The common contact hole may expose portions of the single crystal semiconductor contact pattern, and an ohmic layer may be formed between the conductive contact plug and the exposed portions of the single crystal semiconductor contact pattern. In addition, forming the single crystal semiconductor layer may include forming an amorphous semiconductor layer on the single crystal semiconductor contact pattern and on the first interlayer insulating layer outside the recess, and transforming an amorphous structure of the amorphous semiconductor layer into a single crystal structure. Moreover, transforming the amorphous structure may include annealing the amorphous semiconductor layer.

Before forming the preliminary contact hole, a contact hole may be formed through the second interlayer insulating layer exposing a portion of the first single crystal semiconductor layer, and an epitaxial semiconductor plug may be formed in the contact hole through the second interlayer insulating layer. A second single crystal semiconductor layer may be formed on the epitaxial semiconductor plug and on the second interlayer insulating layer, and a third interlayer insulating layer may be formed on the second single crystal semiconductor layer. In addition, forming the preliminary contact hole may include forming the preliminary contact hole through third interlayer insulating layer, thorough the second single crystal semiconductor layer, through the epitaxial semiconductor plug and the second interlayer insulating layer, through the first single crystal semiconductor layer, through the single crystal semiconductor contact pattern, and through the first interlayer insulating layer to expose a portion of the etch stop layer. Before forming the etch stop layer, a first transistor may be formed on the semiconductor substrate, before forming the second interlayer insulating layer, a second transistor may be formed on the first single crystal semiconductor layer, and before forming the third interlayer insulating layer, a third transistor may be formed on the second single crystal semiconductor layer.

According to still other embodiments of the present invention, a semiconductor device may include a semiconductor substrate and an etch stop layer on the semiconductor substrate. A first interlayer insulating layer may be provided on the etch stop layer, and the first interlayer insulating layer and the etch stop layer include layers of different materials. An insulating plug may extend through the first interlayer insulating layer and the etch stop layer, and a single crystal semiconductor layer may be provided on the first interlayer insulating layer and on the insulating plug. A second interlayer insulating layer may be provided on the single crystal semiconductor layer, and a common contact plug may extend through the second interlayer insulating layer, through the single crystal semiconductor layer, through the first interlayer insulating layer and through the etch stop layer to the semiconductor substrate.

The insulating plug and the common contact plug may be spaced apart. In addition, a first transistor may be provided on the semiconductor substrate such that the etch stop layer is between the first transistor and the single crystal semiconductor layer, and a second transistor may be provided on the single crystal semiconductor layer such that the second transistor is between the second interlayer insulating layer and the first interlayer insulating layer.

The common contact plug may be electrically connected to a gate electrode of the first transistor and/or a gate electrode of the second transistor, and/or the common contact plug may be electrically connected to a source/drain of the first transistor and/or a source/drain of the second transistor. Moreover, a single crystal semiconductor contact pattern may be provided in a recessed portion of the first interlayer insulating layer between the first interlayer insulating layer and the single crystal semiconductor layer, and a sidewall of the single crystal semiconductor contact pattern may be aligned with a sidewall of the insulating plug. In addition, an ohmic layer may be provided between the common contact plug and the single crystal semiconductor layer, and the ohmic layer may include a metal silicide.

According to embodiments of the present invention, methods of forming semiconductor devices having stacked transistors may be provided with common contact holes that can be more accurately formed.

According to other embodiments of the present invention, semiconductor devices may be provided having stacked transistors capable of lowering resistances of common contacts and/or reducing leakage currents.

According to some embodiments of the present invention, a semiconductor device may be provided having stacked transistors with a location of a common contact hole formed by patterning a plurality of interlayer insulating layers and a semiconductor single crystalline layer being different from a location that an epitaxial layer is grown from a semiconductor substrate. Accordingly, it may be possible to use the etch stop layer on the semiconductor substrate to form the common contact hole so that the common contact hole may be formed accurately with reduced damage on the semiconductor substrate. As a result, a resistance of the common contact may be reduced and/or a leakage current may be reduced.

According to embodiments of the present invention, methods of forming a semiconductor device may include forming an etch stop layer on a semiconductor substrate and forming a lower interlayer insulating layer on the etch stop layer. An epitaxial contact pattern may be formed at a recessed region of a top face of the lower interlayer insulating layer, such that the epitaxial contact pattern is not in contact with the etch stop layer, and a top surface of the epitaxial layer may be identical in height to a top surface of the lower interlayer insulating layer. A semiconductor single crystalline layer may be formed, and an upper interlayer insulating layer may be formed. A preliminary common contact hole may be formed exposing the etch stop layer by patterning the upper interlayer insulating layer, the semiconductor single crystalline layer and the lower interlayer insulating layer. A common contact hole may be formed exposing the semiconductor substrate by removing the etch stop layer exposed by the preliminary common contact hole and a common contact plug may be formed to fill the common contact hole.

According to some embodiments of the present invention, the forming of the epitaxial contact pattern may include forming a dual contact hole by patterning the lower interlayer insulating layer and the etch stop layer to expose a predetermined region of the semiconductor substrate. Moreover, the dual contact hole may be configured with an upper contact hole having a first width, and a lower contact hole having a second width less than the first width, and the lower contact hole may overlap the upper contact hole. An epitaxial contact plug may be formed to fill the dual contact hole. An insulating contact hole may be formed to re-expose the semiconductor substrate which is exposed by the lower contact hole by etching the epitaxial contact plug, and simultaneously forming the epitaxial contact pattern within the upper contact hole, and the lower contact hole may overlap the insulating contact hole. An insulating contact plug may be formed to fill the insulating contact hole.

In addition, a first transistor may be formed on the semiconductor substrate before forming the etch stop layer and a second transistor may be formed on the semiconductor single crystalline layer before forming the upper interlayer insulating layer. The common contact hole may expose at least one gate electrode of each of the first and second transistors.

According to further embodiments of the present invention, methods of forming a semiconductor device may include forming a first transistor on a semiconductor substrate and forming an etch stop layer on the semiconductor substrate conformally. A first interlayer insulating layer may be formed on the etch stop layer. A dual contact hole may be formed by patterning the first interlayer insulating layer and the etch stop layer to expose the semiconductor substrate. Moreover, the dual contact hole may be configured with an upper contact hole having a first width, and a lower contact hole having a second width less than the first width, and the lower contact hole may overlap the upper contact hole. An epitaxial contact plug may be formed to fill the dual contact hole. An insulating contact hole may be formed to re-expose the semiconductor substrate which is exposed by the lower contact hole by etching the epitaxial contact plug, and simultaneously forming the epitaxial contact pattern within the upper contact hole. The lower contact hole may overlap the insulating contact hole and an insulating contact plug may be formed to fill the insulating contact hole. A semiconductor single crystalline layer may be formed in contact with the epitaxial contact pattern and a second transistor may be formed on the semiconductor single crystalline layer. A second interlayer insulating layer may be formed to cover the semiconductor single crystalline layer. A preliminary common contact hole may be formed exposing the etch stop layer by patterning the second interlayer insulating layer, the semiconductor single crystalline layer and the first interlayer insulating layer. A common contact hole may be formed exposing the semiconductor substrate by removing the etch stop layer which is exposed by the preliminary common contact hole and a common contact plug may be formed to fill the common contact hole.

Before forming the common contact plug, an ohmic layer may be formed at a side surface of the semiconductor single crystalline layer exposed by the common contact hole and a top surface of the semiconductor substrate, and a diffusion barrier layer may be formed. The epitaxial contact plug may be formed by selective epitaxial growth (SEG) process. Forming the semiconductor single crystalline layer may include forming an amorphous semiconductor layer on the semiconductor substrate in which the epitaxial contact plug is formed and transforming an amorphous structure of the amorphous semiconductor layer into a single crystalline structure by performing an annealing process. Before forming the preliminary common contact hole, an upper contact hole may be formed exposing the semiconductor single crystalline layer by patterning the second interlayer insulating layer, an upper epitaxial contact plug may be formed to fill the upper contact hole, an upper semiconductor single crystalline layer may be formed on the second interlayer insulating layer with the upper semiconductor single crystalline layer in contact with the upper epitaxial contact plug, a third transistor may be formed on the upper semiconductor single crystalline layer, and a third interlayer insulating layer may be formed to cover the upper semiconductor single crystalline layer. Herein, the third interlayer insulating layer, the upper semiconductor single crystalline layer, and the upper epitaxial contact plug may also be etched when forming the preliminary common contact hole.

According to other embodiments of the present invention a semiconductor device may include an etch stop layer and a first interlayer insulating layer formed on a semiconductor device in sequence. An insulating contact plug may be in contact with the semiconductor substrate through the first interlayer insulating and the etch stop layer. A semiconductor single crystalline layer and a second interlayer insulating layer may be formed on the first interlayer insulating layer in sequence. A common contact plug may be in contact with the semiconductor substrate through the second interlayer insulating layer, the semiconductor single crystalline layer, the first interlayer insulating layer, and the etch stop layer.

A first transistor may be disposed on the semiconductor substrate and covered with the etch stop layer. A second transistor may be disposed on the semiconductor single crystalline layer and covered with the second interlayer insulating layer. The common contact plug may be in contact with at least one gate electrode of the first and second transistors. The semiconductor devices may further include an epitaxial contact pattern disposed at a recessed region of an upper portion of the first interlayer insulating layer, and the epitaxial contact pattern may have one sidewall thereof which is aligned with one sidewall of the insulating contact plug.

According to still other embodiments of the present invention, a semiconductor device may include a first transistor formed on a semiconductor substrate and an etch stop layer conformally covering the semiconductor substrate. A first interlayer insulating layer may cover the etch stop layer and an insulating contact plug may be in contact with the semiconductor substrate, which penetrates through the first interlayer insulating layer and the etch stop layer. A semiconductor single crystalline layer may be disposed on the first interlayer insulating layer, and a second transistor may be disposed on the semiconductor single crystalline layer. A second interlayer insulating layer may cover the semiconductor single crystalline layer, and a common contact plug may be in contact with the semiconductor substrate through the second interlayer insulating layer, the semiconductor single crystalline layer, the first interlayer insulating layer and the etch stop layer.

BRIEF DESCRIPTION OF THE DRAWINGS

The accompanying drawings, which are included to provide a further understanding of embodiments of the present invention and are incorporated in and constitute a part of this application, illustrate embodiment(s) of the invention and together with the description serve to explain embodiments of the invention. In the drawings.

DETAILED DESCRIPTION

Figure 1:
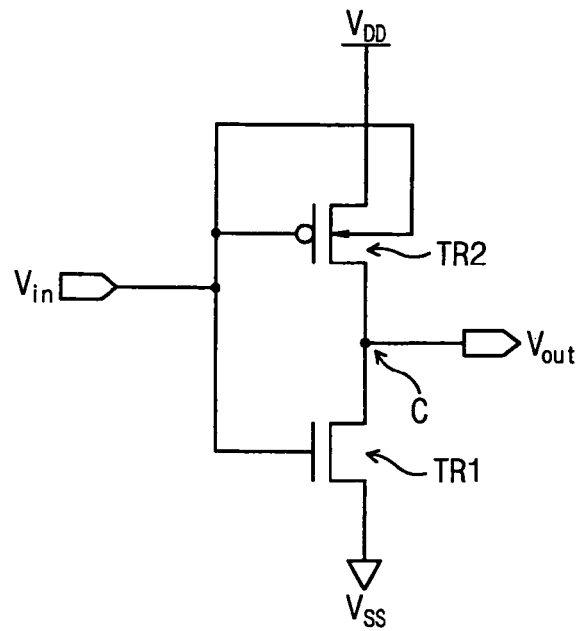
FIG. 1 is an equivalent circuit diagram of a conventional inverter.

The present invention is described more fully hereinafter with reference to the accompanying drawings, in which embodiments of the present invention are shown. This invention may, however, be embodied in many different forms and should not be construed as limited to the embodiments set forth herein. Rather, these embodiments are provided so that this disclosure will be thorough and complete, and will fully convey the scope of the present invention to those skilled in the art. In the drawings, the sizes and relative sizes of layers and regions may be exaggerated for clarity. Like numbers refer to like elements throughout.

It will be understood that when an element or layer is referred to as being "on", "connected to" or "coupled to" another element or layer, it can be directly on, connected or coupled to the other element, or layer or intervening elements or layers may be present. In contrast, when an element is referred to as being "directly on," "directly connected to" or "directly coupled to" another element or layer, there are no intervening elements or layers present. As used herein, the term "and/or" includes any and all combinations of one or more of the associated listed items.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention.

Spatially relative terms, such as "beneath", "below", "lower", "above", "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly. Also, as used herein, "lateral" refers to a direction that is substantially orthogonal to a vertical direction.

The terminology used herein is for the purpose of describing particular embodiments only, and is not intended to be limiting of the present invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Example embodiments of the present invention are described herein with reference to cross-section illustrations that are schematic illustrations of idealized embodiments (and intermediate structures) of the invention. As such, variations from the shapes of the illustrations as a result, for example, of manufacturing techniques and/or tolerances, are to be expected. Thus, embodiments of the present invention should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the present invention.

Unless otherwise defined, all terms (including technical and scientific terms) used herein have the same meaning as commonly understood by one of ordinary skill in the art to which this invention belongs. Accordingly, these terms can include equivalent terms that are created after such time. It will be further understood that terms, such as those defined in commonly used dictionaries, should be interpreted as having a meaning that is consistent with their meaning in the present specification and in the context of the relevant art, and will not be interpreted in an idealized or overly formal sense unless expressly so defined herein. All publications, patent applications, patents, and other references mentioned herein are incorporated by reference in their entirety.

FIGS. 6 to 13 are cross-sectional views illustrating methods of forming an inverter according to first embodiments of the present invention.

Figure 6:
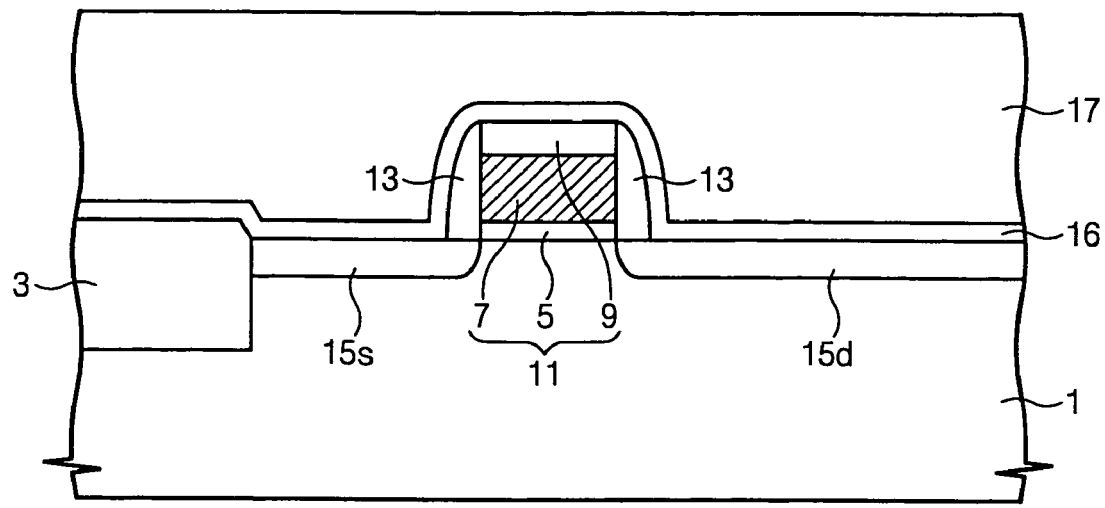
FIGS. 6 to 13 are cross-sectional views illustrating methods for forming an inverter according to embodiments of the present invention.

Referring to FIG. 6, a first isolation layer 3 may be formed in a semiconductor substrate 1 using a shallow trench isolation (STI) process or other isolation process to define an active region(s). A thermal oxidation process may be performed over the semiconductor substrate 1 to form a first gate oxide layer 5 on the active region. A first gate electrode layer 7 and a first capping layer 9 may be stacked on an entire surface of the semiconductor substrate 1 and patterned to form a first gate pattern 11. The first gate electrode layer 7 may be formed of at least one of polysilicon doped with impurities, tungsten, tungsten silicide, and/or tungsten nitride. An ion implantation process may be performed using the first gate pattern 11 as an ion implantation mask to form first impurity implantation regions 15s and 15d, to provide a first transistor. The first impurity implantation regions may define a first source region 15s and a first drain region 15d. A first spacer 13 may be formed covering sidewalls of the first gate pattern 11. The first spacer 13, for example, may be formed of at least one of a silicon oxide layer, a silicon oxynitride layer, and/or a silicon nitride layer. While not shown in the drawings, a heavily doped region may be formed using the first spacer 13 and the first gate pattern 11 as an implantation mask. An etch stop layer 16 may be conformally formed on the entire surface of the semiconductor substrate 1. A first interlayer insulating layer 17 may be formed to cover the first transistor. The etch stop layer 16 may be formed of a material different than that used for the first interlayer insulating layer 17 (e.g., a silicon oxide layer), different than that used for a semiconductor single crystalline layer, (e.g., a silicon layer 23 shown in FIG. 10), and different than that used for the semiconductor substrate 1 (e.g., a silicon substrate) to provide an etch selectivity. The etch stop layer 16, for example, may include a layer of silicon nitride.

Figure 7:
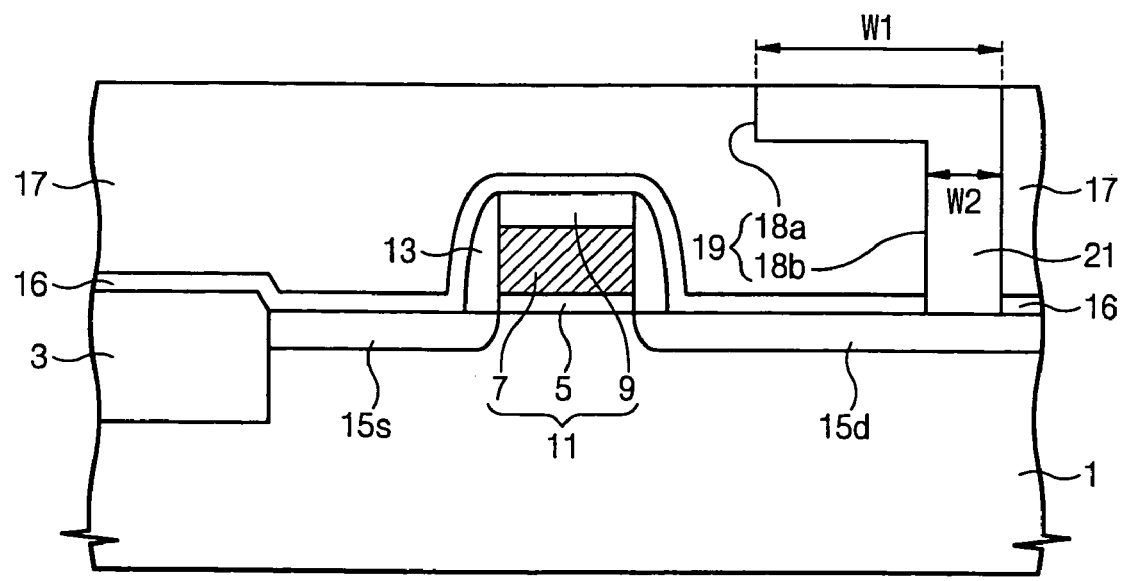

Referring to FIG. 7, the first interlayer insulating layer 17 and the etch stop layer 16 may be etched in sequence to form a dual contact hole 19 which exposes the first drain region 15d of the semiconductor substrate 1. The dual contact hole 19 may be configured with an upper contact hole 18a having a first width W1 and a lower contact hole 18b having a second width W2 that is smaller than the first width W1, wherein the lower contact hole 18b overlaps the upper contact hole 18a.

The dual contact hole 19 may be formed using a conventional dual damascene process for forming a contact hole. The lower contact hole 18b may be formed at a predetermined location which is different from a location of a common contact hole which will be formed in a following process. After forming the dual contact hole 19, an epitaxial contact plug 21 may be formed in the dual contact hole 19 using, for example, a selective epitaxial growth (SEG) or a solid phase epitaxial growth (SPEG) process.

Figure 8:
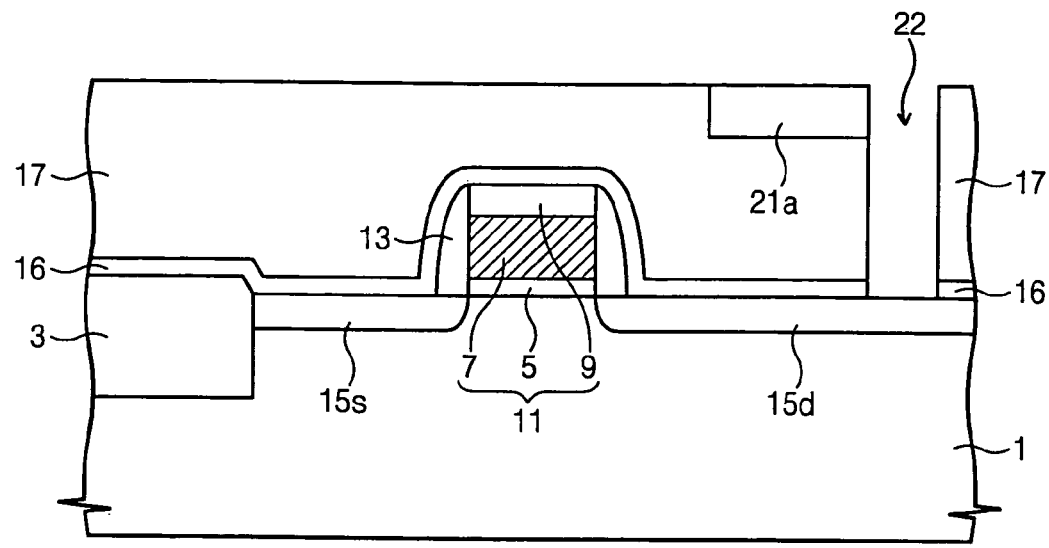

Referring to FIG. 8, the epitaxial contact plug 21 may be patterned to form an insulating contact hole 22 which re-exposes the drain region 15d of the semiconductor substrate 1 that had been exposed by the lower contact hole 18b. At this time, an epitaxial contact pattern 21a may still remain in the upper contact hole 18a. The insulating contact hole 22 may be formed such that it has a width substantially identical to the second width W2 of the lower contact hole 18b.

Figure 9:
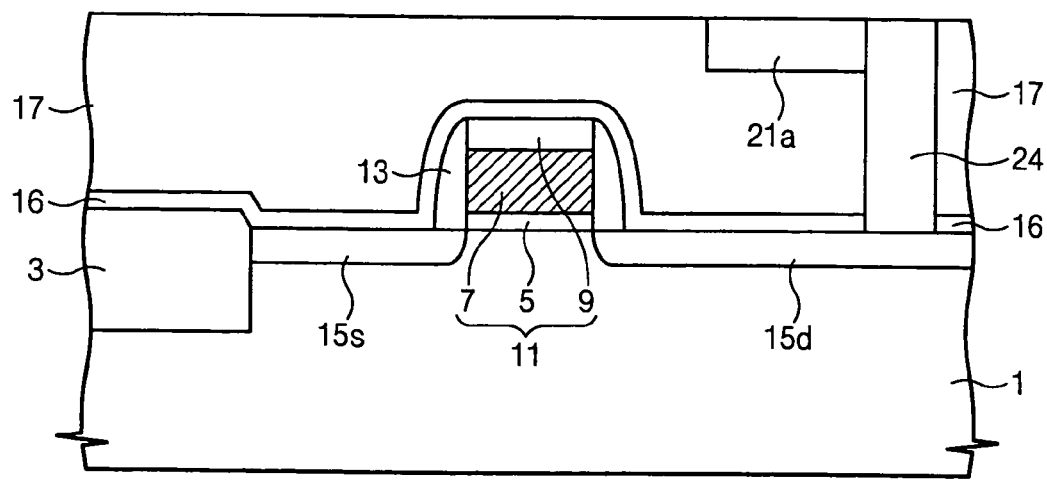

Referring to FIG. 9, an insulating layer may be formed to fill the insulating contact hole 22. Afterwards, a planarization process may be performed to expose the epitaxial contact pattern 21a and to simultaneously form an insulating contact plug 24 in the insulating contact hole 22. The insulating layer, for example, may be formed of the same material used for the first interlayer insulating layer 17.

Figure 10:
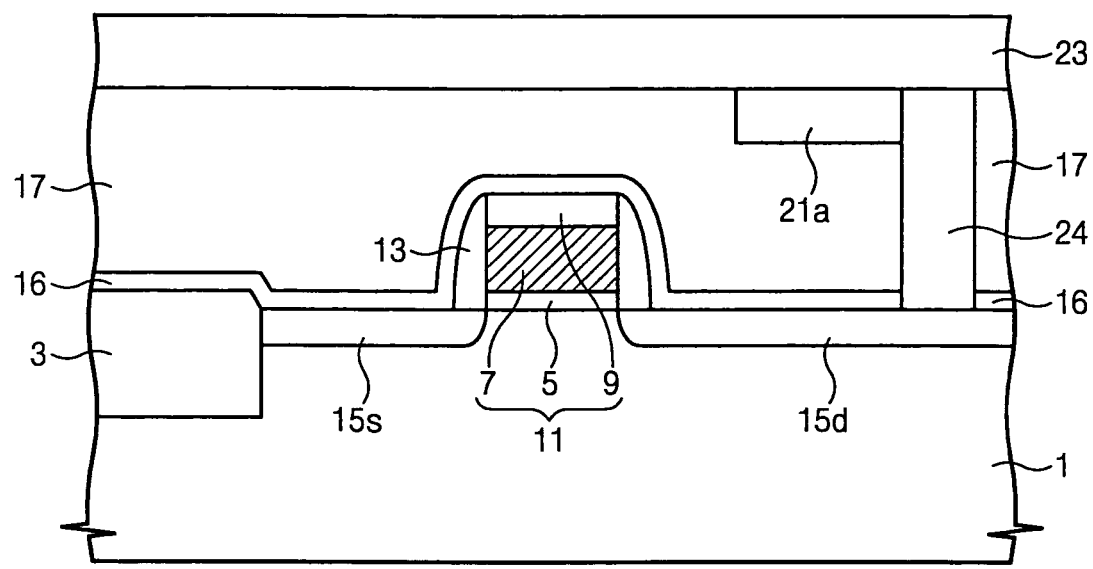

Referring to FIG. 10, a semiconductor single crystalline layer 23 may be formed on the entire surface of the semiconductor substrate 1. The semiconductor single crystalline layer 23, for instance, may be formed using the SPEG process which transforms an amorphous structure of an amorphous polysilicon layer (not shown) into a single crystalline silicon structure by annealing the amorphous polysilicon layer formed over the entire surface of the semiconductor substrate 1. Herein, a top surface of the epitaxial contact pattern 21a may act as a single crystalline seed layer. Alternatively, the semiconductor single crystalline layer 23 may be formed by epitaxially growing an epitaxial layer from the epitaxial contact pattern 21a using, for example, the SEG process. In this case, a chemical mechanical polishing (CMP) process may be additionally performed to planarize a top surface thereof.

Figure 11:
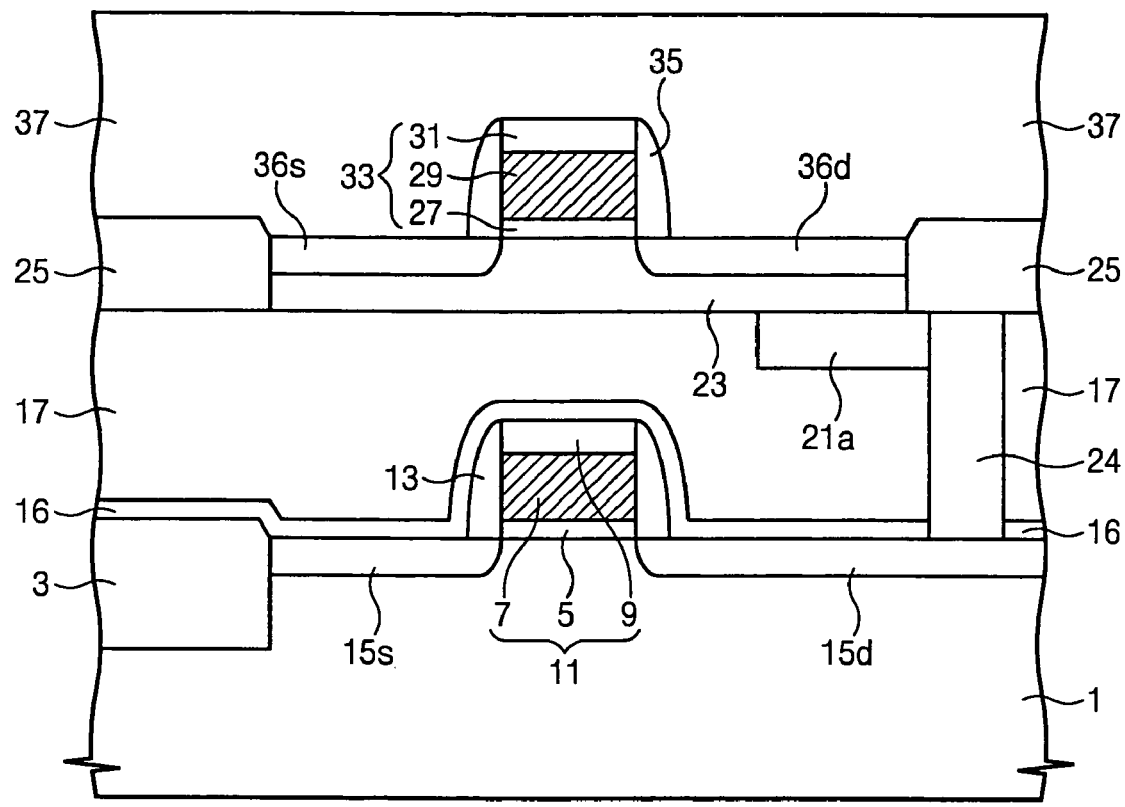

Referring to FIG. 11, a second isolation layer 25 may be formed on the semiconductor single crystalline layer 23 using, for example, an STI process. Although it is illustrated in FIG. 11 that the second isolation layer 25 may be in contact with the first interlayer insulating layer 17, the second isolation layer 25 may be spaced from the first interlayer insulating layer 17. Furthermore, while it is illustrated in FIG. 11 that the second isolation layer 25 may be in contact with the insulating contact plug 24, the second isolation layer 25 may be spaced from the insulating contact plug 24. A reason to form the insulating contact plug 24 of an insulating material is to electrically disconnect a conductive pattern which may be formed on the insulating contact plug 24 from the semiconductor substrate 1, which may improve a process margin when forming the conductive pattern. A second gate pattern 33 and a second spacer 35 covering sidewalls of the second gate pattern 33 may be formed on the semiconductor single crystalline layer 23. The second gate pattern 33 may include a second gate oxide layer 27, a second gate electrode 29 and a second capping layer 31. An ion implantation process may be performed to form a second source region 36s and a second drain region 36d, to provide a second transistor. Thereafter, a second interlayer insulating layer 37 may be formed to cover the second transistor.

Figure 12:
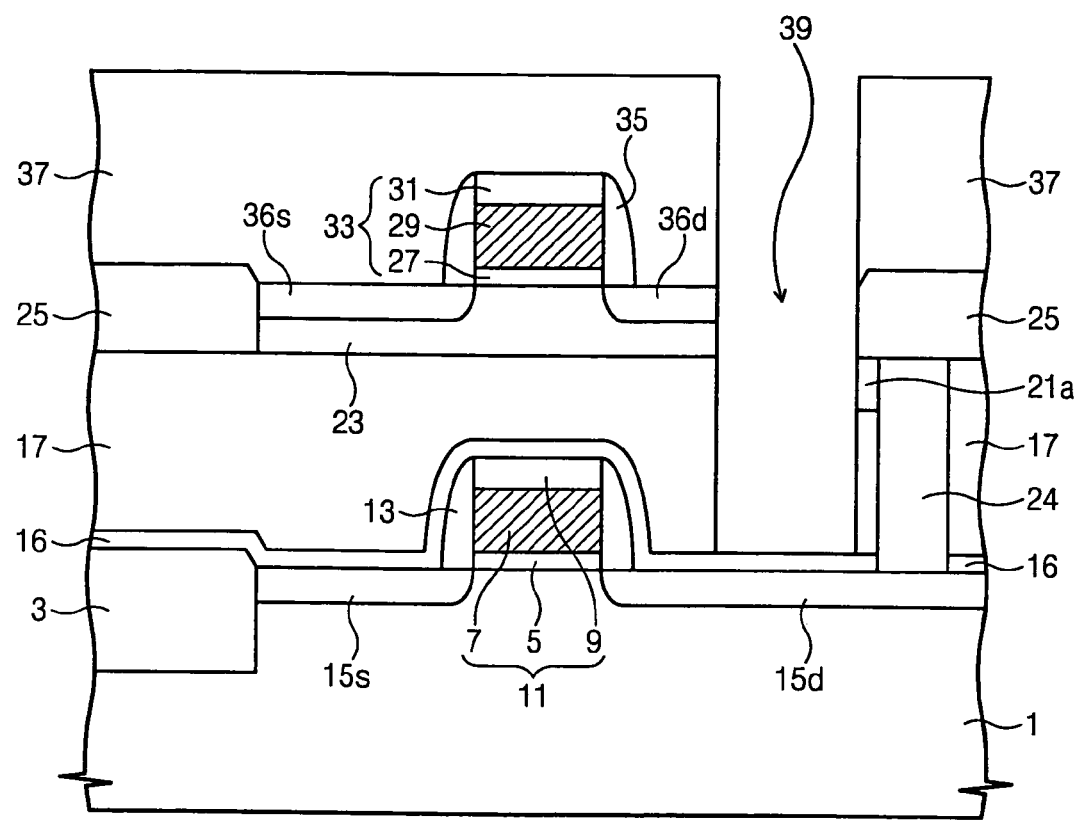

Referring to FIG. 12, the second interlayer insulating layer 37, the semiconductor single crystalline layer 23, the epitaxial contact pattern 21a and the first interlayer insulating layer 17 are patterned in sequence to form a preliminary common contact hole 39 which exposes the etch stop layer 16 on the first drain region 15d. The preliminary common contact hole 39 is formed at a predetermined location different from a location of the bottom of the lower contact hole 18b which is a region that an epitaxial layer is grown from the semiconductor substrate 1. The preliminary common contact hole 39 may be formed at a location that does not overlap the insulating contact plug 24. Therefore, the etch stop layer 16 may remain under the preliminary common contact hole 39.

The preliminary common contact hole 39 may be formed at another location different than the location illustrated in FIG. 12. For example, the common contact hole 39 may be formed such that the plug 24 is between the hole 39 and the gate pattern 11. In this case, when forming the preliminary contact hole 39, the epitaxial contact pattern 21a may not be etched. Moreover, the locations of the drain regions 15d and 36d may be interchanged with those of the source regions 15s and 36s. The preliminary common contact hole 39 may expose the second isolation layer 25. The preliminary common contact hole 39 may be formed by performing an etching process using an etch recipe that does not substantially etch the etch stop layer 16. Therefore, even though the etching process time may be extended, the etch stop layer 16 may not be substantially etched so that the semiconductor substrate 1 under the etch stop layer 16 is not exposed. Accordingly, it may be possible to protect the underlying semiconductor substrate using the etch stop layer 16.

Figure 13:
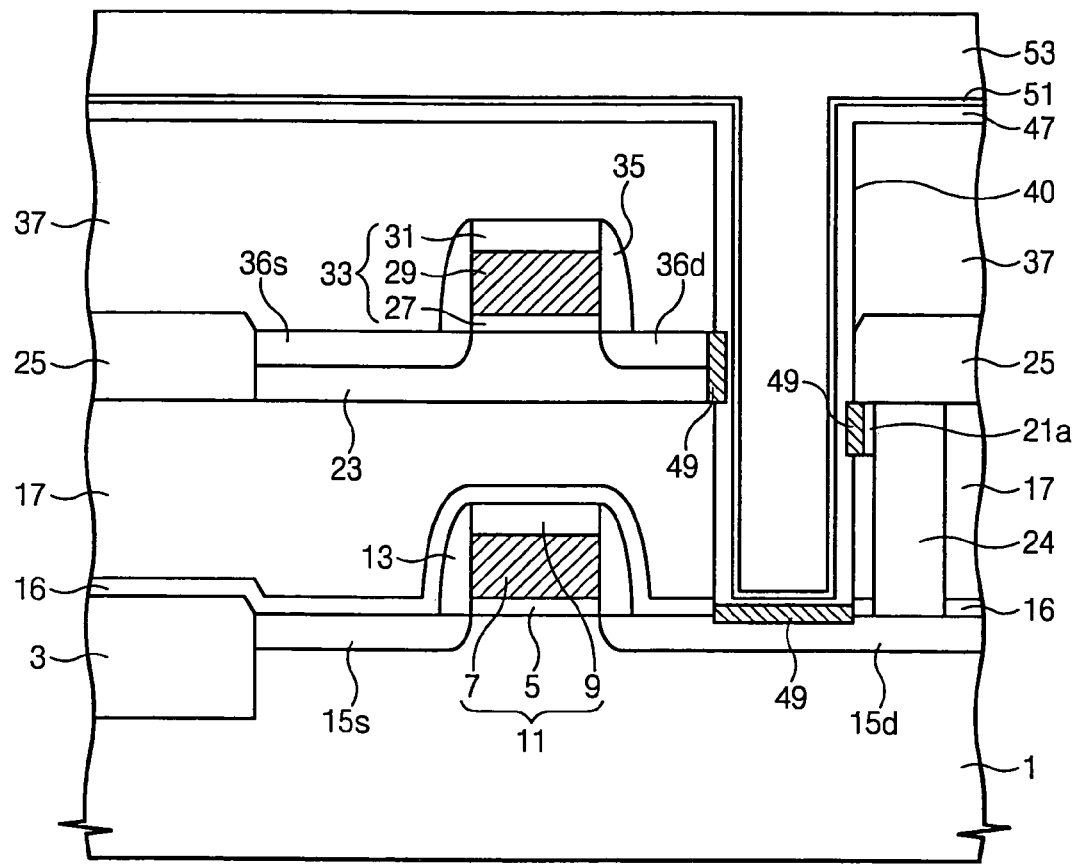

Referring to FIG. 13, the etch stop layer 16 exposed by the preliminary common contact hole 39 may be removed, for example, using a wet or dry etching process, to thereby form a common contact hole 40 which exposes the first drain region 15d. In greater detail, the etch stop layer 16 may be removed using an etch recipe that does not substantially etch the semiconductor single crystalline layer 23, the semiconductor substrate 1, the interlayer insulating layers 17 and 37, and/or the isolation layer 25, but that does etch the etch stop layer 16. As a result, the surface of the semiconductor substrate 1 may not be significantly damaged during the etching process. Thereafter, a metal layer 47 may be conformally formed on the entire surface of the semiconductor substrate 1. The metal layer 47 may be formed, for example, by atomic layer deposition (ALD) process and/or chemical vapor deposition (CVD) process. The metal layer 47, for example, may be formed of at least one of titanium, cobalt, nickel, and/or tungsten. After forming the metal layer 47, an annealing process may be performed to form an ohmic layer 49 between the metal layer 47 and the semiconductor single crystalline layer 23, between the metal layer 47 and the semiconductor substrate 1, and between the metal layer 47 and the epitaxial contact pattern 21a. In addition, the ohmic layer 49 may be formed at the same time as the metal layer 47 is formed using an ALD process and/or a CVD process. The ohmic layer 49, for example, may be formed of a metal silicide, and the metal may be titanium, cobalt, nickel, and/or tungsten. A barrier metal layer 51 and/or a diffusion barrier layer may be conformally formed on the entire surface of the semiconductor substrate 1, and a conductive layer 53 may be formed to fill the common contact hole 40. The barrier metal layer 51, for example, may be formed of at least one of a titanium nitride layer, a tantalum nitride layer, a tungsten nitride layer, a titanium aluminum nitride layer, and/or a tantalum aluminum nitride layer. The conductive layer, for example, may be formed of tungsten. A planarization process may be performed over the conductive layer 53 to form a common contact plug to fill the common contact hole 40.

In methods of forming inverters having stacked transistors according to embodiments of the present invention, since it may be possible to use the etch stop layer when forming the common contact hole, the common contact hole may be formed accurately without damage on the semiconductor substrate. Therefore, it may be possible to reduce leakage current and/or reduce common contact resistance.

In the inverter structure of FIG. 13, the first gate pattern 11, the first source region 15s and the first drain region 15d, for example, may correspond to the first transistor TR1 which has been illustrated in the equivalent circuit diagram of the conventional inverter with reference to FIG. 1. Likewise, the second gate pattern 35, the second source region 36s and the second drain region 36d may correspond to the second transistor TR2 of FIG. 1. In addition, the common contact plug may correspond to the drain node C of FIG. 1.

Methods of forming SRAM devices having transistors stacked in three layers according to other embodiments of the present invention will be discussed with reference to the cross-sectional views of FIGS. 14 to 20.

Figure 14:
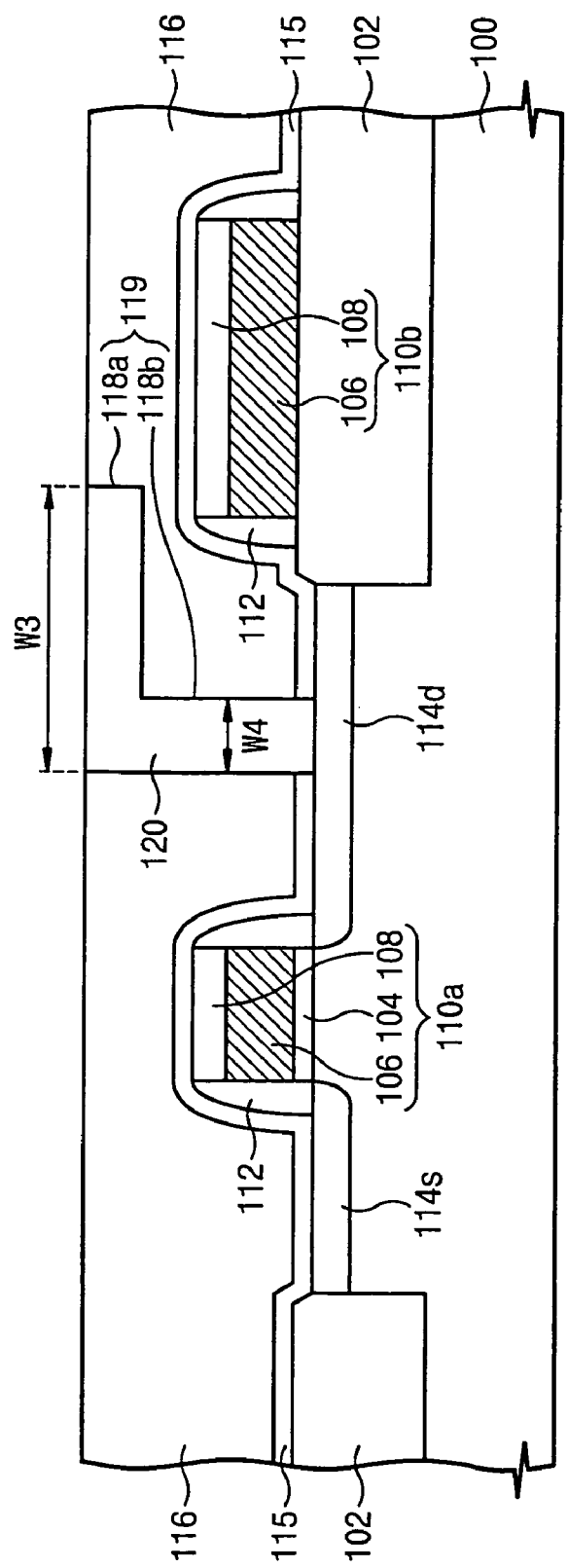
FIGS. 14 to 20 are cross-sectional views illustrating methods of forming an SRAM device according to other embodiments of the present invention.

Referring to FIG. 14, a first isolation layer 102 may be formed on a semiconductor substrate 100 using an STI process to define an active region. A thermal oxidation process may be performed on the semiconductor substrate 100 to form a first gate oxide layer 104 in the active region. A first gate electrode layer 106 and a first capping layer 108 may be stacked on the entire surface of the semiconductor substrate 100 and patterned to form a first drive gate pattern 110a and a second drive gate pattern 10b. A first spacer(s) 112 may be formed to cover sidewalls of each drive gate pattern 10a and 10b. The first spacer(s) 112 may be formed, for example, of a silicon oxide layer and/or a silicon oxynitride layer. An ion implantation process may be performed to form a first source region 114s and a first drain region 114d. Although it is illustrated that the second drive gate pattern 110b in FIGS. 14 to 20 may be disposed on the isolation layer 102, the second drive gate pattern 110b may include a gate oxide layer and source/drain regions at positions thereof extending to other active regions not shown in FIG. 14, wherein the source/drain regions may be disposed on both sides of the second drive gate pattern 110b.

Thereafter, referring to FIG. 14, an etch stop layer 115 may be conformally formed on the entire surface of the semiconductor substrate 100 on which the drive gate patterns 110a and 110b are formed. The etch stop layer 115, for example, may be a silicon nitride layer. A first interlayer insulating layer 116 may be formed on the etch stop layer 115 and a top surface thereof may be planarized. The first interlayer insulating layer 116 and the etch stop layer 115 may be etched in sequence to form a dual contact hole 119 which exposes the first drain region 114d of the semiconductor substrate 100. The dual contact hole 119 may be configured with an upper contact hole 118a having a first width W3 and a lower contact hole 118b having a second width W4 which is smaller than the first width W3, and the lower contact hole 118b may overlap the upper contact hole 118a. The dual contact hole 119 may be formed using a conventional dual damascene process. Meanwhile, the lower contact hole 118b may be formed at a location which is different from a location of a common contact hole which will be formed in a following process. After forming the dual contact hole 19, a first epitaxial contact plug 120 may be formed to fill the dual contact hole 119 using an SEG process and/or an SPEG process.

Figure 15:
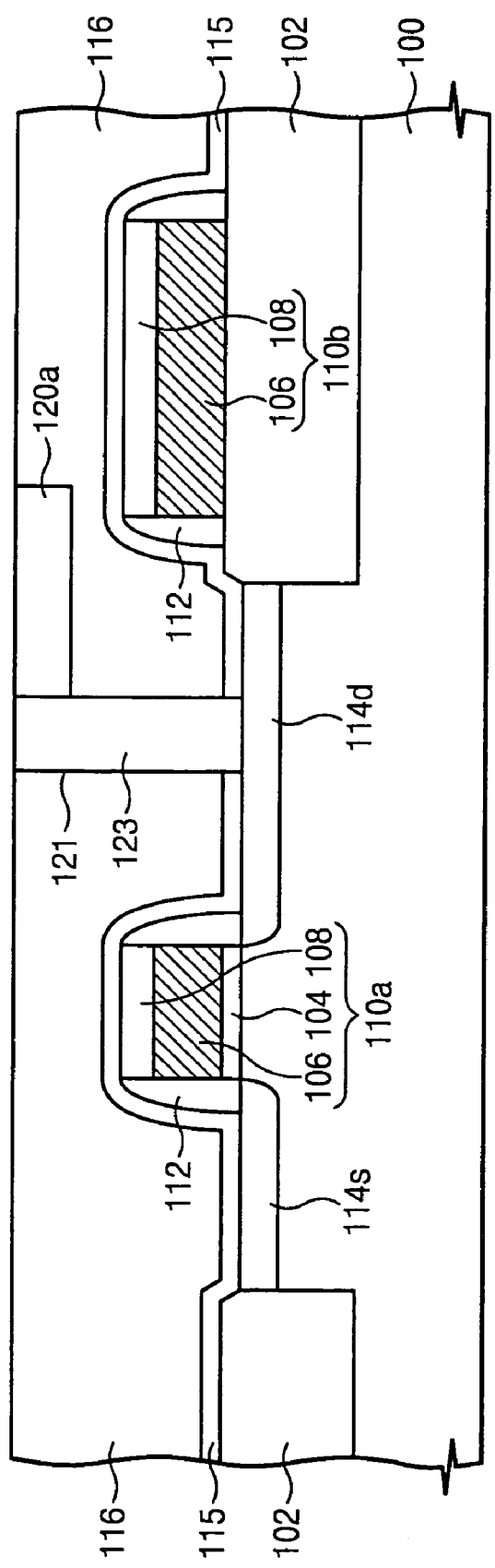

Referring to FIG. 15, the first epitaxial contact plug 120 may be patterned to form an insulating contact hole 121 which re-exposes the drain region 114d of the semiconductor substrate 100 that was previously exposed by the lower contact hole 118b. At this time, an epitaxial contact pattern 120a may remain in the upper contact hole 118a. The insulating contact hole 121 may be formed such that it has a width that is substantially the same as the second width W4 of the lower contact hole 118b. An insulating layer may be formed to fill the insulating contact hole 121. Thereafter, a planarization process may be performed to expose the epitaxial contact pattern 120a and to simultaneously form an insulating contact plug 123 filling the insulating contact hole 121. The insulating layer, for example, may be formed of the same material used for the first interlayer insulating layer 116.

Figure 16:
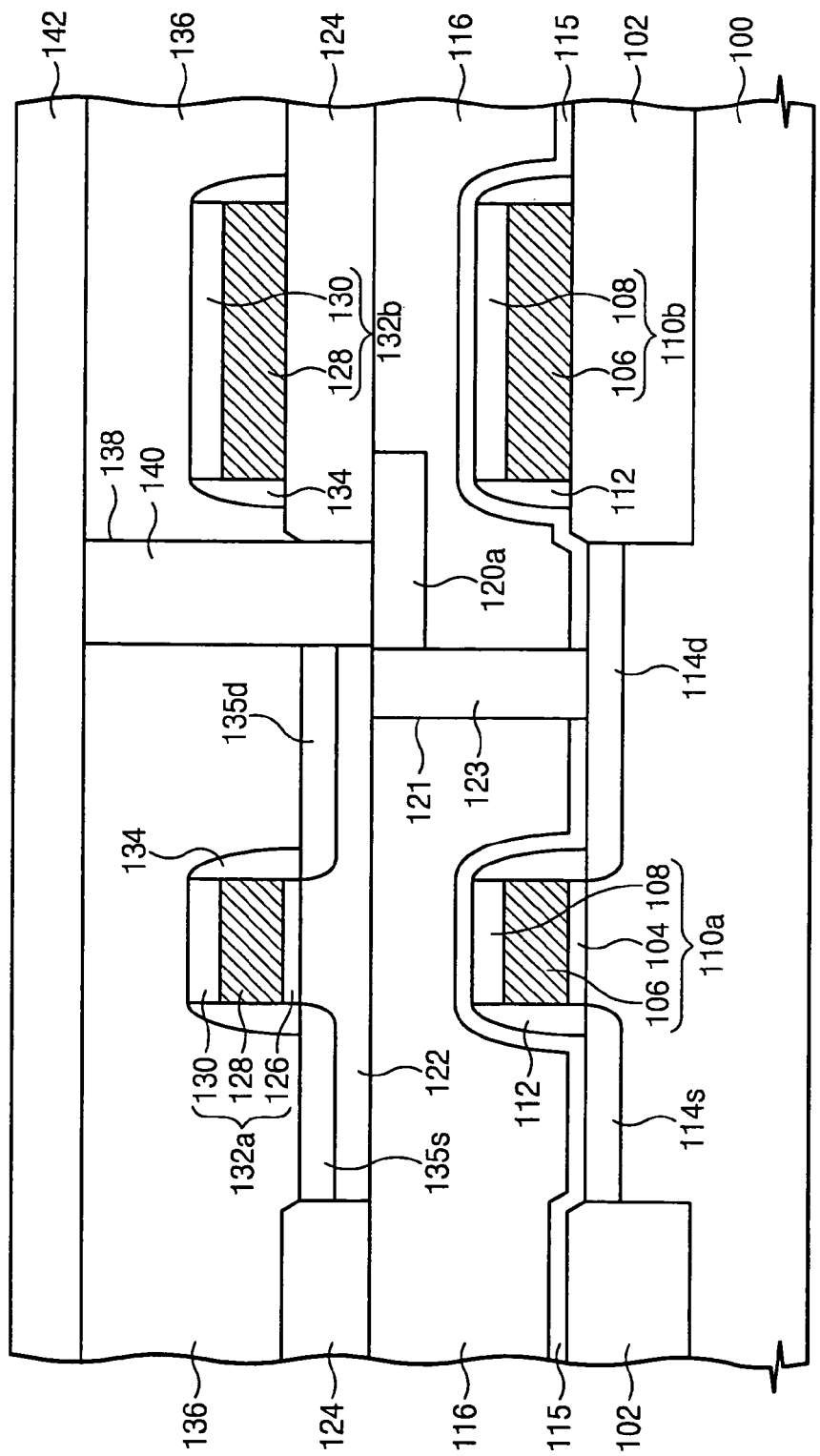

Referring to FIG. 16, a first semiconductor single crystalline layer 122 may be formed over an entire surface of the semiconductor substrate 100. The first semiconductor single crystalline layer 122 may be formed using the epitaxial contact pattern 120a as a single crystalline seed layer, similar to a process(s) of forming the semiconductor single crystalline layer 23 which has been discussed above with reference to FIG. 10. A second isolation layer 124 may be formed on the first semiconductor single crystalline layer 122 using an STI process. A first load gate pattern 132a, a second load gate pattern 132b, and a second spacer(s) 134 covering sidewalls of each load gate pattern 132a and 132b may be formed, and each of the first and second load gate patterns 132a and 132b may be provided with a second gate oxide layer 126, a second gate electrode 128 and a second capping layer 130. Afterwards, an ion implantation process may be performed to form a second source region 135s and a second drain region 135d. Thereafter, a second interlayer insulating layer 136 may be formed and patterned to form a contact hole 138 which partially exposes the epitaxial contact pattern 120a. A second epitaxial contact plug 140 may be formed to fill the epitaxial contact hole 138 using an SEG process. A second semiconductor single crystalline layer 142 may be formed on the second interlayer insulating layer 136 and the second contact plug 140.

Figure 17:
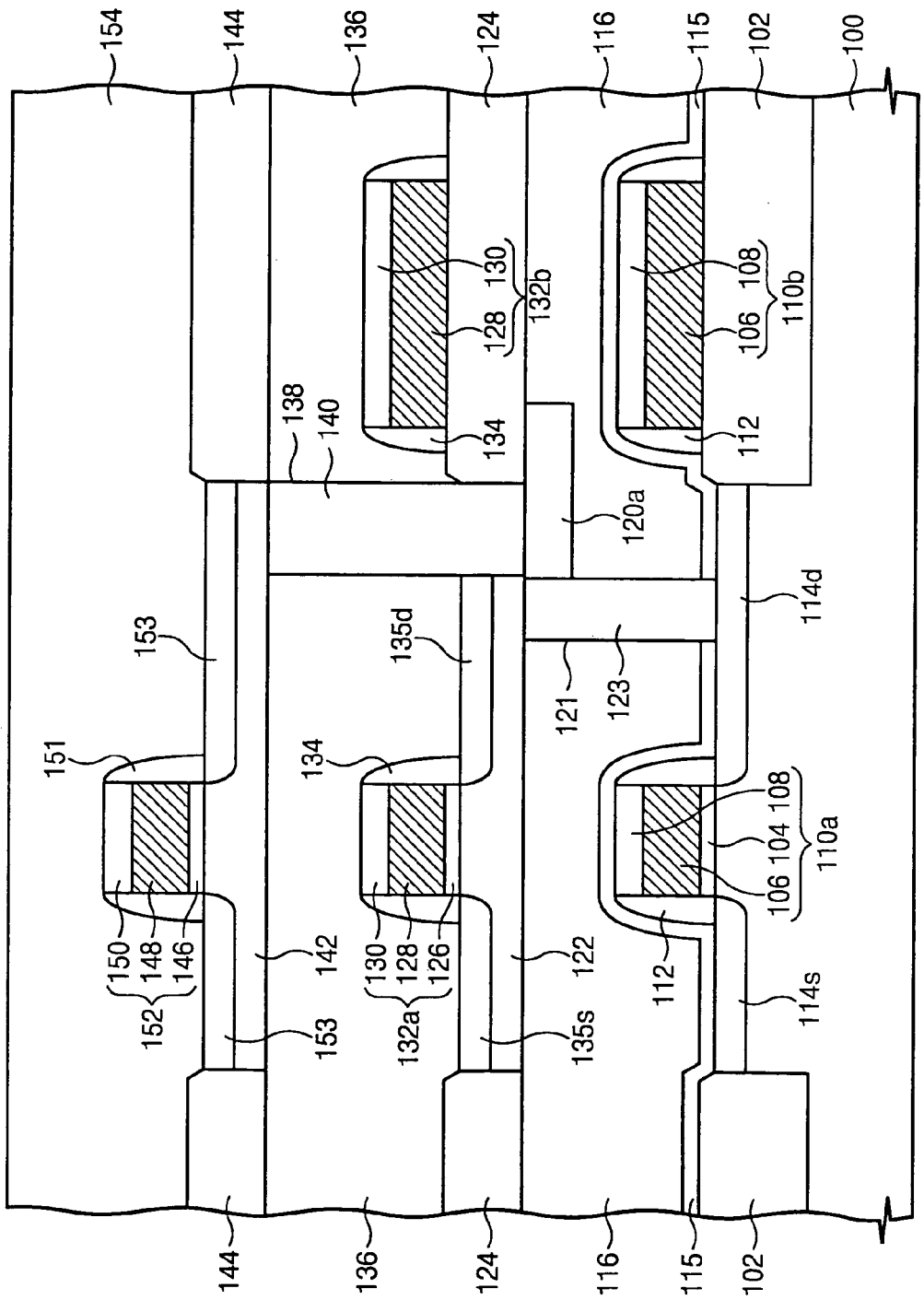

Referring to FIG. 17, a third isolation layer 144 may be formed on the second semiconductor single crystalline layer 142 using an STI process. A transfer gate pattern 152 and a third spacer(s) 151 may be formed, and the transfer gate pattern 152 may be configured with a third gate oxide layer 146, a third gate electrode 148 and a third capping layer 150. An ion implantation process may be performed to form third source/drain regions 153. Thereafter, a third interlayer insulating layer 154 may be formed. While not shown in the drawings, there may exist another transfer gate pattern on the second semiconductor single crystalline layer 142 such that the other transfer gate pattern may be disposed over the second load gate pattern 132b.

Figure 18:
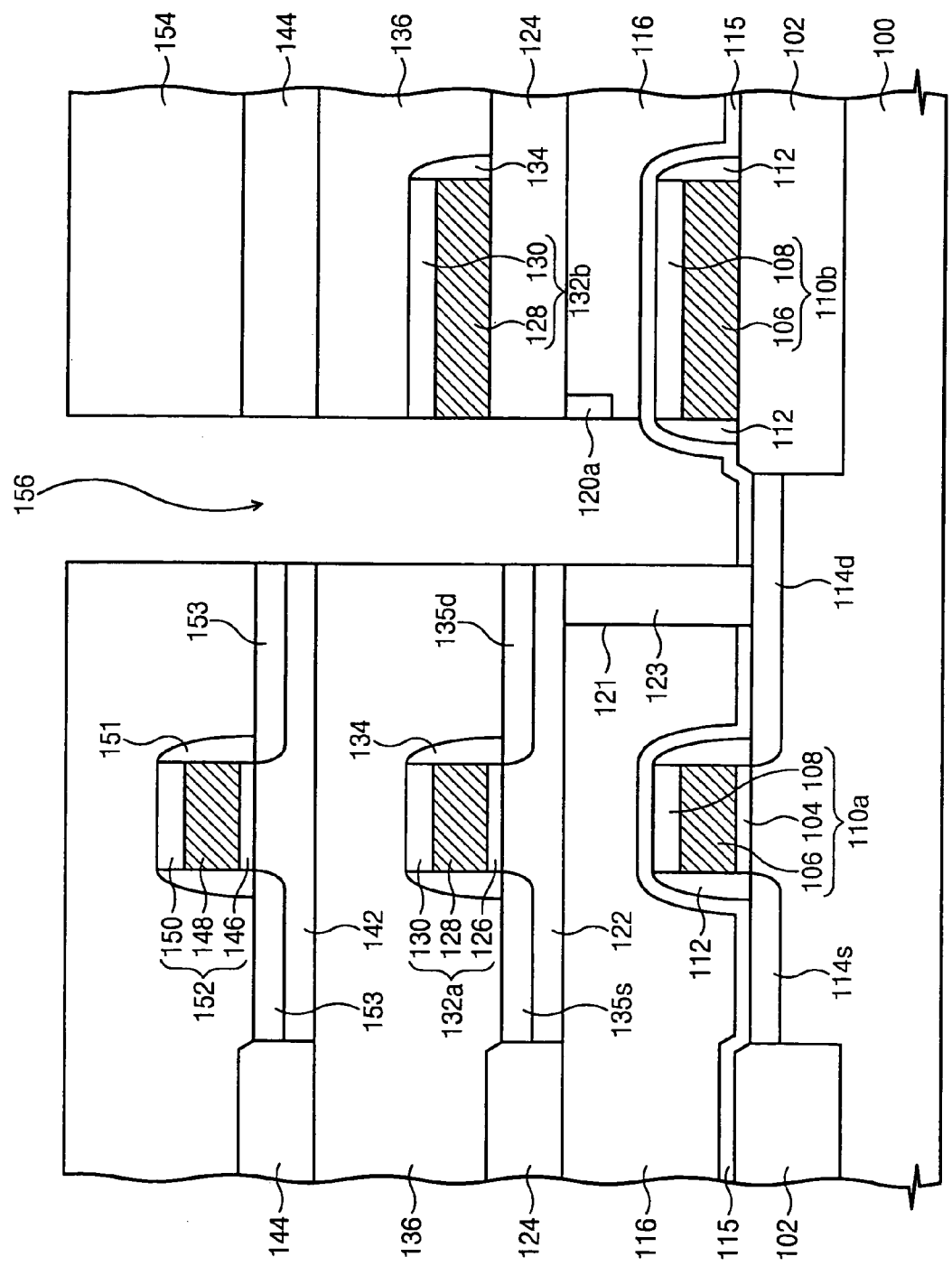

Referring to FIG. 18, the third interlayer insulating layer 154, the second semiconductor single crystalline layer 142, the second interlayer insulating layer 136, the first semiconductor single crystalline layer 122, and the first interlayer insulating layer 116 may be patterned in sequence to form a preliminary common contact hole 156 having a width greater than that of the contact hole 138. The contact hole 138 may overlap the preliminary common contact hole 156. When forming the preliminary common contact hole 156, the second epitaxial contact plug 140 and the epitaxial contact pattern 120a may also be etched. In addition, portions of the isolation layers 124 and 144, a portion(s) of the second capping layer 130, and a portion(s) of the second spacer 134 may be removed to expose the second gate electrode 128 of the second load gate pattern 132b. The preliminary common contact hole 156 may expose the etch stop layer 15 on the first drain region 114d. As illustrated in FIG. 18, since the preliminary common contact hole 156 is formed by sequentially patterning a plurality of layers, the preliminary common contact hole 156 may be relatively narrow and deep. Thus, it may be difficult to accurately form the common contact hole without damaging the semiconductor substrate 100. However, according to embodiments of the present invention, since the etch stop layer 115 remains intact at the bottom of the preliminary common contact hole 156 to protect portions of the semiconductor substrate 100 thereunder, it may be possible to form the preliminary common contact hole 156 without significantly damaging on the semiconductor substrate 100.

Figure 19:
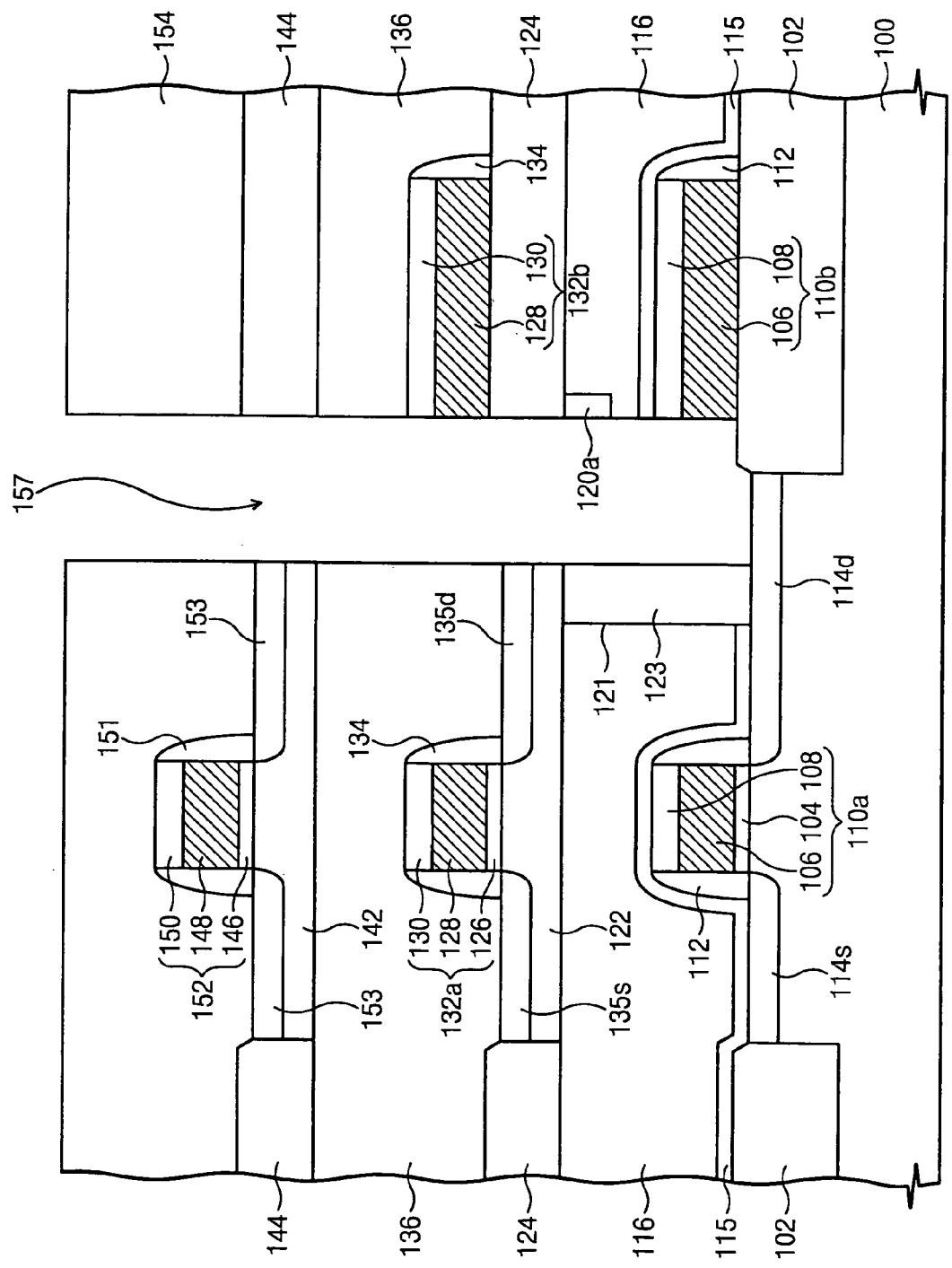

Referring to FIG. 19, portions of the etch stop layer 115 exposed by the preliminary common contact hole 156 may be selectively removed to form a common contact hole 157 exposing the first drain region 114d. A portion of the first capping layer 108 and the first spacer 112 formed on one sidewall of the second drive gate pattern 110b may be removed to expose the gate electrode 106 of the second drive gate pattern 110b.

Figure 20:
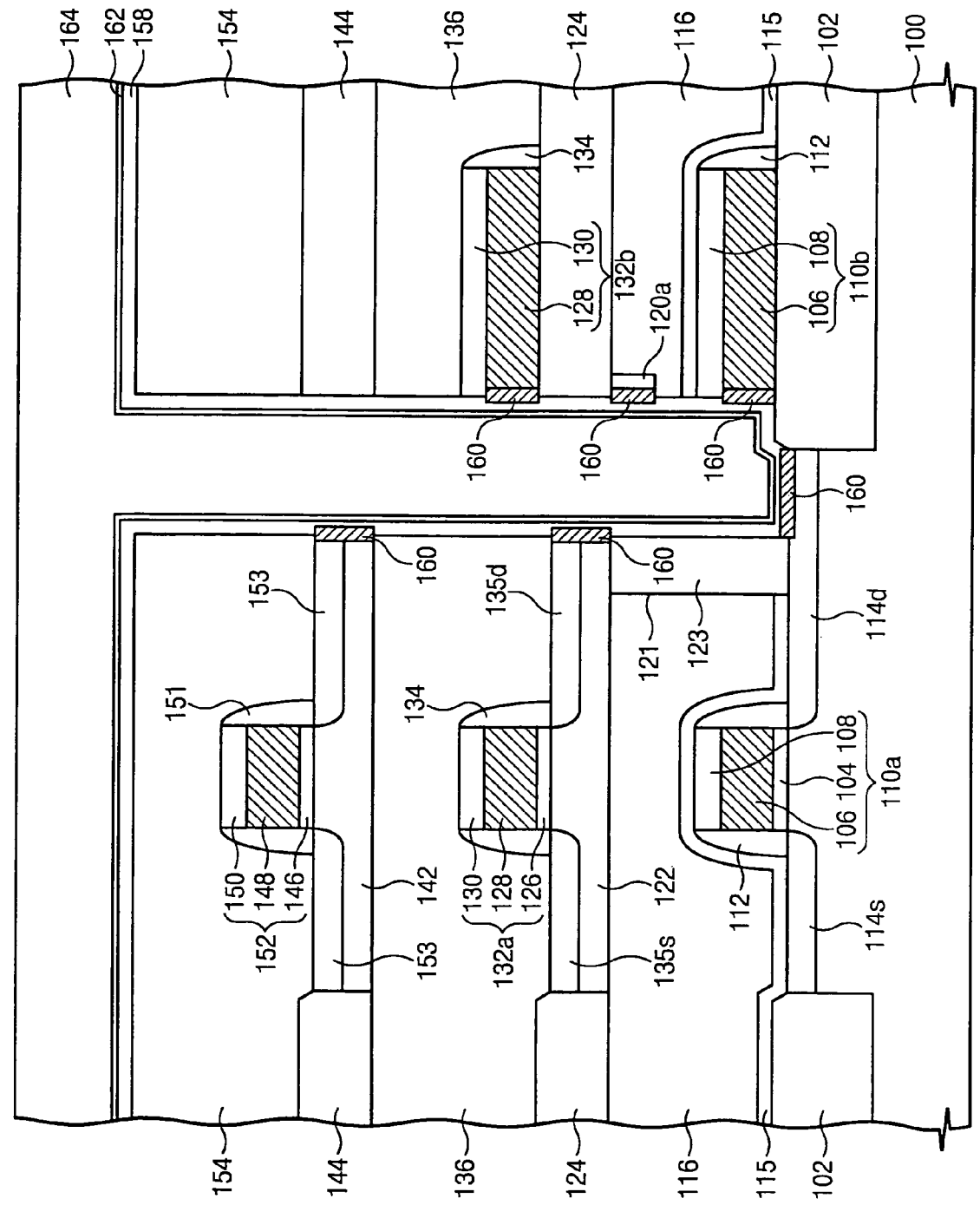

Referring to FIG. 20, a metal layer 158 may be conformally formed on the entire surface of the semiconductor substrate 100. An annealing process may be performed to form an ohmic layer 160 between the metal layer 158 and the semiconductor substrate 100, between the metal layer 158 and the first gate electrode 106, between the metal layer 158 and the epitaxial contact pattern 120a, between the metal layer 158 and the second gate electrode 128, and between the metal layer 158 and the second semiconductor single crystalline layer 142. Afterwards, a barrier metal layer 162 or a diffusion barrier layer may be conformally formed on the entire surface of the semiconductor substrate 100, and a conductive layer 164 may be formed in the common contact hole. A planarization process may be performed over the conductive layer 164 to form a common contact plug in the common contact hole 157.

When forming the common contact hole for the SRAM device having the stacked transistors according to embodiments of the present invention, it may be possible to form the common contact hole accurately without significantly damaging the semiconductor substrate. Accordingly, it may be possible to reduce leakage current, and/or reduce common contact resistance.

Figure 2:
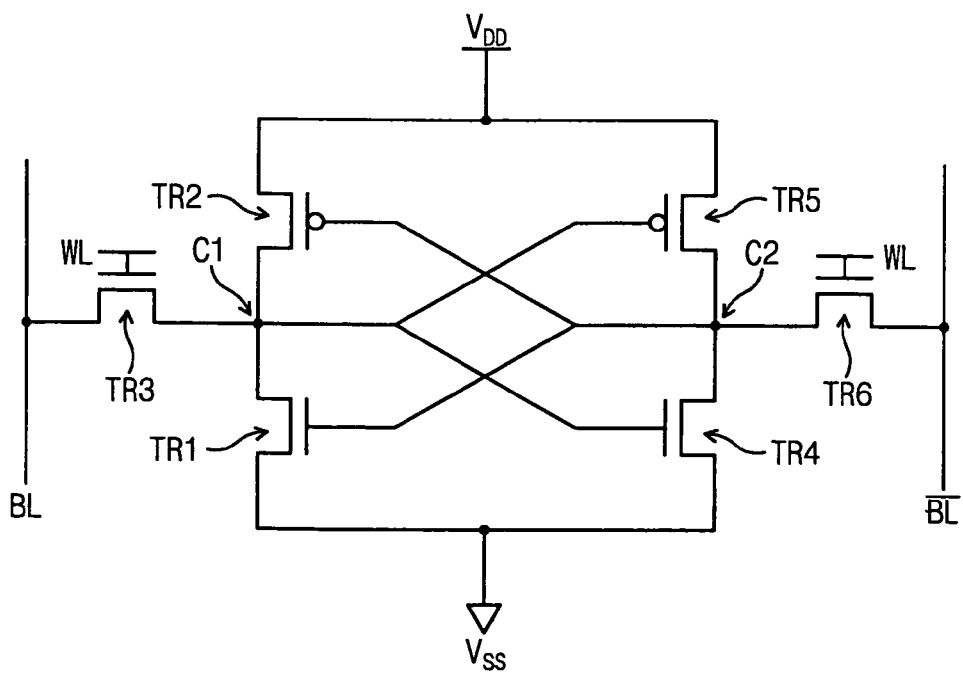
FIG. 2 is an equivalent circuit diagram of a conventional full complementary metal oxide semiconductor (CMOS) static random access memory (SRAM) device.
Figure 3:
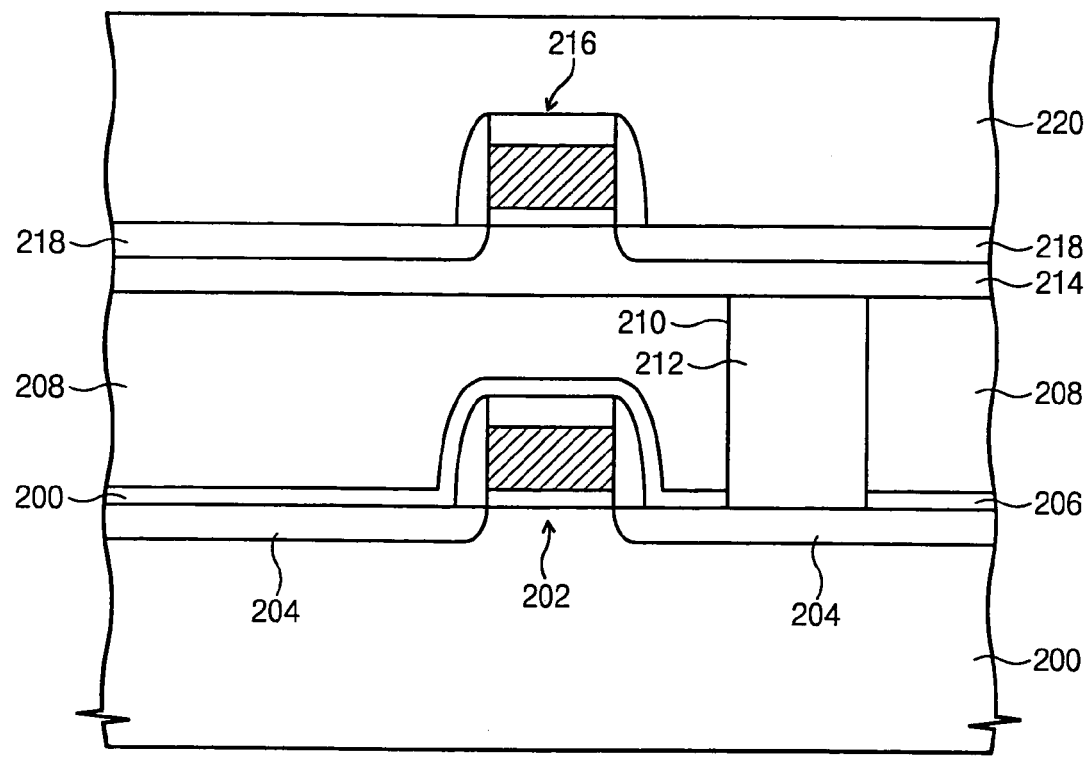
FIGS. 3 to 5 are cross-sectional views illustrating a conventional method of forming a common contact hole in a semiconductor device having stacked transistors.
Figure 4:
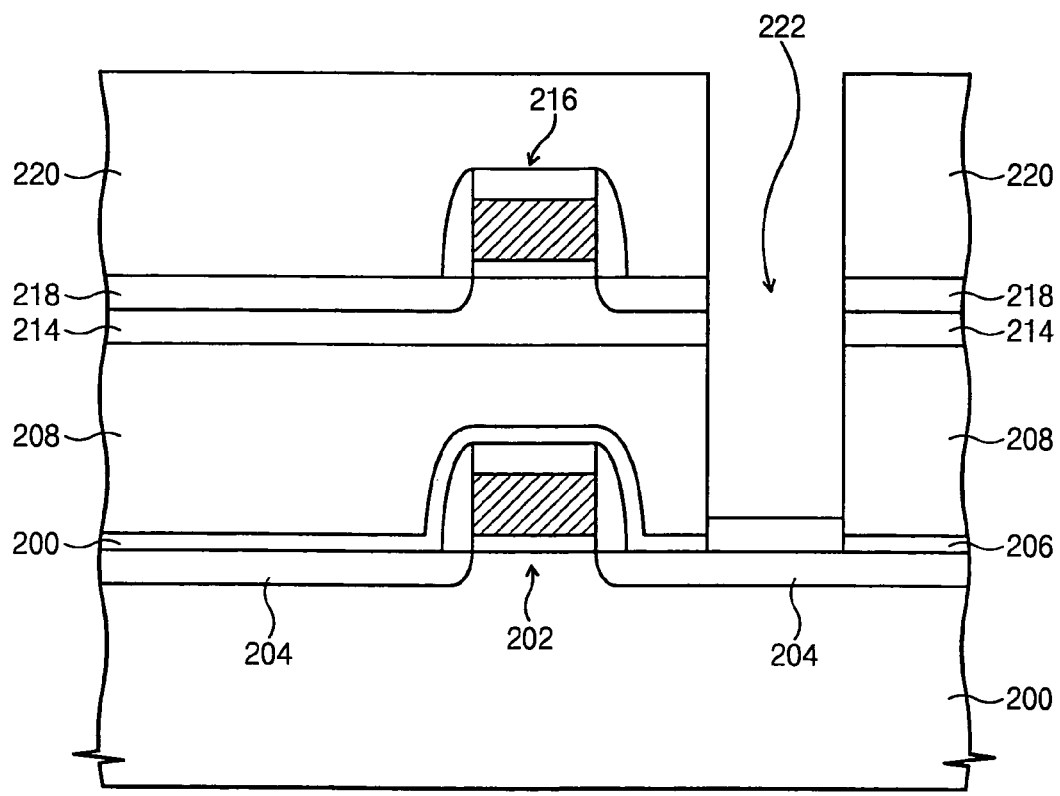
Figure 5:
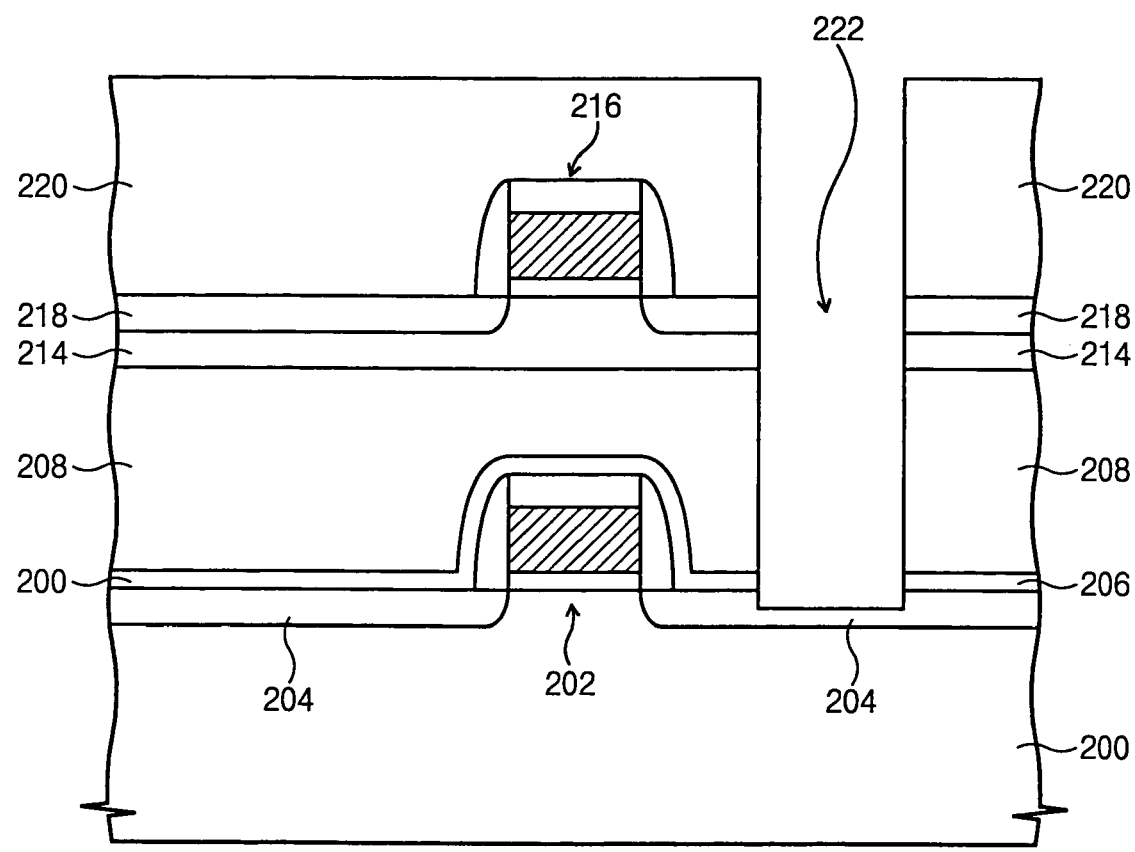

In the SRAM device of FIG. 20, the first drive gate pattern 110a may correspond to one of the gate patterns of the drive transistors TR1 or TR4 in FIG. 2, and the second drive gate pattern 10b may correspond to the other one of the drive transistors TR1 or TR4 in FIG. 2. The first load gate pattern 132a may correspond to one of the gate patterns of the load transistors TR2 or TR5 in FIG. 2, and the second load gate pattern 132b may correspond to the other one of the gate patterns of the load transistors TR2 or TR5 in FIG. 2. The transfer gate pattern 152 may correspond to one of the transfer transistors TR3 and/or TR6. The common contact plug may correspond to one of the common terminals C1 and/or C2 in FIG. 2.

According to methods of forming semiconductor devices having stacked transistors in accordance with embodiments of the present invention, the location of a common contact hole formed by patterning a plurality of interlayer insulating layers and a semiconductor single crystalline layer may be different from a location that the epitaxial layer is grown from the semiconductor substrate. Accordingly, it may be possible to use the etch stop layer on the semiconductor substrate to form the common contact hole so that the common contact hole may be formed accurately without significantly damaging the semiconductor substrate. As a result, in semiconductor devices formed using methods according to embodiments of the present invention a resistance of the common contact may be reduced and/or a leakage current may be reduced.

While the present invention has been particularly shown and described with reference to embodiments thereof, it will be understood by those of ordinary skill in the art that various changes in form and details may be made therein without departing from the spirit and scope of the present invention as defined by the following claims.

What is claimed is:

1. A method of forming a semiconductor device, the method comprising:
   forming an interlayer insulating layer on a semiconductor substrate, wherein the interlayer insulating layer has a contact hole therein exposing a portion of the semiconductor substrate;
   forming a single crystal semiconductor plug in the contact hole and on portions of the interlayer insulating layer adjacent the contact hole opposite the semiconductor substrate, wherein portions of the interlayer insulating layer opposite the semiconductor substrate are free of the single crystal semiconductor plug;
   removing portions of the single crystal semiconductor plug in the contact hole while maintaining portions of the single crystal semiconductor plug on portions of the interlayer insulating layer adjacent the contact hole as a single crystal semiconductor contact pattern;
   after removing portions of the single crystal semiconductor plug, forming a single crystal semiconductor layer on the interlayer insulating layer and on the single crystal semiconductor contact pattern;
   forming a second interlayer insulating layer on the single crystal semiconductor layer;
   forming a common contact hole through the second interlayer insulating layer, through the single crystal semiconductor layer, and through the first interlayer insulating layer to expose a portion of the semiconductor substrate; and
   forming a conductive contact plug in the common contact hole in contact with the semiconductor substrate.

2. A method according to claim 1 further comprising:
   before forming the first interlayer insulating layer, forming an etch stop layer on the semiconductor substrate;
   wherein the etch stop layer and the interlayer insulating layer comprise different materials, wherein the contact hole extends through the first interlayer insulating layer and the etch stop layer;
   wherein forming the common contact hole further comprises forming the common contact hole through the etch stop layer.

3. A method according to claim 1 wherein the interlayer insulting layer includes a recess therein adjacent the contact hole opposite the semiconductor substrate, and wherein forming a single crystal semiconductor plug comprises forming the single crystal semiconductor plug in the contact hole and in the recess adjacent the contact hole.

4. A method according to claim 1 further comprising:
   after removing portions of the single crystal semiconductor plug in the contact hole and before forming the single crystal semiconductor layer, forming an insulating plug in the contact hole.

5. A method according to claim 1 further comprising:
   before forming the interlayer insulating layer, forming a first transistor on the semiconductor substrate; and
   before forming the second interlayer insulating layer, forming a second transistor on the single crystal semiconductor layer.

6. A method according to claim 5 wherein the common contact hole exposes a gate electrode the first transistor and/or a gate electrode of the second transistor.

7. A method according to claim 5 wherein the conductive contact plug is electrically connected to a gate electrode of the first transistor and/or a gate electrode of the second transistor.

8. A method according to claim 5 wherein the common contact hole exposes a source/drain region of the first transistor and/or a source/drain region of the second transistor.

9. A method according to claim 5 wherein the conductive contact plug is electrically connected to a source/drain region of the first transistor and/or a source/drain region of the second transistor.

10. A method of forming a semiconductor device, the method comprising:
   forming an etch stop layer on a semiconductor substrate;
   forming a first interlayer insulating layer on the etch stop layer, wherein the etch stop layer and the interlayer insulating layer comprise different materials;
   forming a single crystal semiconductor contact pattern in a recess of the first interlayer insulating layer, wherein portions of the first interlayer insulating layer outside the recess are free of the single crystal semiconductor contact pattern and wherein the single crystal semiconductor contact pattern is isolated from the semiconductor substrate;
   forming a single crystal semiconductor layer on the single crystal semiconductor contact pattern and on the first interlayer insulating layer outside the recess;
   forming a second interlayer insulating layer on the single crystal semiconductor layer;
   forming a preliminary contact hole through the second interlayer insulating layer, through the single crystal semiconductor layer, through the single crystal semiconductor contact pattern, and through the first interlayer insulating layer to expose a portion of the etch stop layer;
   forming a common contact hole by removing the portion of the etch stop layer exposed through the preliminary contact hole; and
   forming a conductive contact plug in the common contact hole.

11. A method according to claim 10 wherein forming the single crystal semiconductor contact pattern comprises:
   forming a dual width contact hole having a relatively narrow portion extending through the interlayer insulating layer and through the etch stop layer to expose the semiconductor substrate and having a relatively wide portion extending only partially through the first interlayer insulating layer;
   forming an epitaxial semiconductor contact plug in the relatively narrow and relatively wide portions of the dual width contact hole;
   removing at least portions of the semiconductor contact plug from the relatively narrow portion of the dual width contact hole while maintaining portions of the semiconductor contact plug in the relatively wide portion of the contact hole; and
   forming an insulating plug in the relatively narrow portion of the dual width contact hole.

12. A method according to claim 11 wherein the insulating plug and the etch stop layer comprise different materials.

13. A method according to claim 11 wherein forming the epitaxial semiconductor contact plug comprises forming the epitaxial semiconductor contact plug using selective epitaxial growth (SEG) process.

14. A method according to claim 10 further comprising:
   before forming the etch stop layer, forming a first transistor on the semiconductor substrate; and
   before forming the second interlayer insulating layer, forming a second transistor on the single crystal semiconductor layer.

15. A method according to claim 14 wherein the common contact hole exposes a gate electrode the first transistor and/or a gate electrode of the second transistor.

16. A method according to claim 14 wherein the conductive contact plug is electrically connected to a gate electrode of the first transistor and/or a gate electrode of the second transistor.

17. A method according to claim 14 wherein the common contact hole exposes a source/drain region of the first transistor and/or a source/drain region of the second transistor.

18. A method according to claim 14 wherein the conductive contact plug is electrically connected to a source/drain region of the first transistor and/or a source/drain region of the second transistor.

19. A method according to claim 10 wherein surfaces of the single crystal semiconductor contact pattern and the first interlayer insulating layer opposite the semiconductor substrate are substantially within a same plane.

20. A method according to claim 10 wherein the common contact hole exposes portions of the single crystal semiconductor layer and the semiconductor substrate, the method further comprising:
   forming an ohmic layer between the conductive contact plug and the exposed portions of the single crystal semiconductor layer and the semiconductor substrate.

21. A method according to claim 20 wherein the ohmic layer comprises a metal silicide.

22. A method according to claim 10 wherein forming the conductive contact plug comprises forming a conformal metal layer on the second interlayer insulating layer, on sidewalls of the common contact hole, and on an exposed portion of the semiconductor layer, forming a conformal barrier layer on the metal layer, and forming a metal plug on the barrier layer.

23. A method according to claim 13 wherein the barrier layer comprises a metal nitride.

24. A method according to claim 10 wherein the common contact hole exposes portions of the single crystal semiconductor contact pattern, the method further comprising:
   forming an ohmic layer between the conductive contact plug and the exposed portions of the single crystal semiconductor contact pattern.

25. A method according to claim 10 wherein forming the single crystal semiconductor layer comprises:
   forming an amorphous semiconductor layer on the single crystal semiconductor contact pattern and on the first interlayer insulating layer outside the recess; and
   transforming an amorphous structure of the amorphous semiconductor layer into a single crystal structure.

26. A method according to claim 25 wherein transforming the amorphous structure comprises annealing the amorphous semiconductor layer.

27. A method according to claim 10 further comprising before forming the preliminary contact hole:
   forming a contact hole through the second interlayer insulating layer exposing a portion of the first single crystal semiconductor layer;
   forming an epitaxial semiconductor plug in the contact hole through the second interlayer insulating layer;
   forming a second single crystal semiconductor layer on the epitaxial semiconductor plug and on the second interlayer insulating layer; and
   forming a third interlayer insulating layer on the second single crystal semiconductor layer;
   wherein forming the preliminary contact hole comprises forming the preliminary contact hole through third interlayer insulating layer, thorough the second single crystal semiconductor layer, through the epitaxial semiconductor plug and the second interlayer insulating layer, through the first single crystal semiconductor layer, through the single crystal semiconductor contact pattern, and through the first interlayer insulating layer to expose a portion of the etch stop layer.

28. A method according to claim 27 further comprising:

before forming the etch stop layer, forming a first transistor on the semiconductor substrate;

before forming the second interlayer insulating layer, forming a second transistor on the first single crystal semiconductor layer; and before forming the third interlayer insulating layer, forming a third transistor on the second single crystal semiconductor layer.

* * * * *